(12) United States Patent
Takeshita

(10) Patent No.: US 9,230,657 B2
(45) Date of Patent: Jan. 5, 2016

(54) MEMORY DEVICE WITH ERASE MODE MEMORY CELLS

(71) Applicant: Renesas Electronics Corporation, Kawasaki-shi, Kanagawa (JP)

(72) Inventor: Toshiaki Takeshita, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 229 days.

(21) Appl. No.: 13/952,591

(22) Filed: Jul. 27, 2013

(65) Prior Publication Data

US 2014/0036591 A1  Feb. 6, 2014

(30) Foreign Application Priority Data

Jul. 31, 2012 (JP) ................................. 2012-169549

(51) Int. Cl.
*G11C 16/10* (2006.01)
*G11C 16/14* (2006.01)
*G11C 16/04* (2006.01)
*G11C 16/26* (2006.01)

(52) U.S. Cl.
CPC ............ *G11C 16/10* (2013.01); *G11C 16/0416* (2013.01); *G11C 16/14* (2013.01); *G11C 16/26* (2013.01)

(58) Field of Classification Search
CPC . G11C 21/0026; G11C 16/10; G11C 10/0491

USPC ...................................................... 365/185.05
See application file for complete search history.

(56) References Cited

U.S. PATENT DOCUMENTS

| 6,441,427 B1* | 8/2002 | Yamada | H01L 27/115 257/315 |
| 7,697,330 B1* | 4/2010 | Bellippady | G11C 16/0441 365/185.05 |
| 7,804,716 B2 | 9/2010 | Kwak et al. | |
| 7,974,127 B2* | 7/2011 | Chong | G11C 5/04 365/185.16 |

FOREIGN PATENT DOCUMENTS

| JP | 2000-049316 A | 2/2000 |
| JP | 2002-043444 A | 2/2002 |
| JP | 2004-031617 A | 1/2004 |
| JP | 2009-038382 A | 2/2009 |

* cited by examiner

*Primary Examiner* — Hoai V Ho
*Assistant Examiner* — Minh Dinh
(74) *Attorney, Agent, or Firm* — Miles & Stockbridge P.C.

(57) ABSTRACT

A memory device includes a memory cell array including a plurality of memory cells, a common source line to which sources of the plurality of memory cells are commonly connected, and a second electrical connection path further connecting the common source line to a ground voltage using erase-mode memory cells when the common source line forms a first electrical connection path and is connected to the ground voltage.

17 Claims, 30 Drawing Sheets

1 DATA READ

0 DATA READ

US 9,230,657 B2

MEMORY DEVICE WITH ERASE MODE MEMORY CELLS

CROSS-REFERENCE TO RELATED APPLICATIONS

This application is based upon and claims the benefit of priority from Japanese patent application No. 2012-169549, filed on Jul. 31, 2012, the disclosure of which is incorporated herein in its entirety by reference.

BACKGROUND

The present invention relates to a memory device and, particularly, to a memory device including a common source line that commonly connects sources of a plurality of memory cells.

Flash memory has been widely used as nonvolatile memory, and a larger capacity and a higher speed are demanded with the advancement of information and communications technology.

FIG. 27A shows a structure of a memory cell constituting a typical flash memory. Note that the memory cell is the minimum unit to store information of "0" or "1".

As shown in FIG. 27A, a memory cell 10 is one type of MOSFET (Metal-Oxide-Semiconductor Field-Effect Transistor) and includes an insulated floating gate 13, which is different from a typical MOSFET. A selection gate (word gate) 11 is formed above the floating gate 13, and the floating gate 13 and the selection gate 11 are insulated from each other with an inter-polysilicon dielectric film 12 interposed therebetween. The inter-polysilicon dielectric film 12 is called "inter-poly dielectric (IPD)" because the selection gate 11 and the floating gate 13 are generally made of polysilicon. Further, a gate dielectric film 14 is formed between the floating gate 13 and a silicon substrate, which is the same as a typical MOSFET. Further, inside the surface of the silicon substrate, electrodes serving as a source 16 and a drain 15 are formed with a gate placed therebetween, which is the same as a typical MOSFET.

As shown in FIG. 27B, the memory cell 10 performs storage operation by accumulating charge in the floating gate 13. Because the floating gate 13 is completely insulated from the surroundings, it has a structure (nonvolatile structure) where the accumulated charge does not escape from the gate even when the power is off. Thus, the memory cell 10 stores one bit of data depending on the presence or absence of charge by electrons in the floating gate 13.

The memory cell array according to related art where such memory cells are arranged in an array is disclosed in Japanese Unexamined Patent Application Publication No. 2000-49316. FIGS. 28A to 28C show the memory cell array according to related art disclosed therein.

As shown in FIGS. 28A to 28C, in a memory cell array 900 according to related art, a source region 903 and a drain region 904 are formed separately from each other in the surface area of a silicon substrate 901. The source region 903 is formed in a continuous pattern along the row direction and commonly connected between adjacent memory cells (common source line). On a channel region between the source region 903 and the drain region 904 of each cell transistor, a floating gate 906 is formed with a tunnel oxide film 905 interposed therebetween.

A control gate 908 is formed above the floating gate 906 with a dielectric film 907 interposed therebetween. The control gate 908 lies along the row direction and forms a word line.

On the above-described stacked gate structure, an interlayer dielectric film 909 is formed, and a bit line 910 and a source line 911 are formed on the interlayer dielectric film 909 along the column direction intersecting each word line (control gate) 908. The source line 911 is connected to the source region 903 via a through hole 913 in a source contact portion 912, and the bit line 910 is connected to the drain region 904 via a through hole 914.

SUMMARY

In the memory cell array according to related art disclosed in Japanese Unexamined Patent Application Publication No. 2000-49316, the common source line is formed by commonly connecting the sources of a plurality of memory cells, and the common source line is provided with a source contact to thereby make a connection from the common source line up to a metal line layer (source line).

By providing the source contact at intervals of several memory cells, it is possible to reduce the circuit area compared with the case of providing the source contact at each memory cell.

On the other hand, the manufacturing process of a memory device is becoming increasingly finer, and the resistance of a source resistor from a source region to a metal line of a memory cell is significantly large, which hinders high-speed operation. However, if the resistance of a source resistor is reduced by increasing the number of source contacts in order to enable high-speed operation, the circuit area increases.

Therefore, the memory device according to related art has a problem that it is difficult to achieve high-speed operation without significant increase in circuit area.

A first aspect of the present invention is a memory device including a memory cell array including a plurality of memory cells, a common source line to which sources of the plurality of memory cells are commonly connected in the memory cell array, and a second electrical connection path further connecting the common source line to a ground voltage when the common source line forms a first electrical connection path and is connected to the ground voltage, wherein the second electrical connection path is formed using a first memory cell included in the plurality of memory cells.

A second aspect of the present invention is a memory device including a plurality of memory cells having a source and a drain formed on a surface of a semiconductor substrate and a gate formed including a floating gate on the semiconductor substrate between the source and the drain, a memory cell array where the plurality of memory cells are arranged in an array, a common source line formed continuously on the surface of the semiconductor substrate in the memory cell array so that sources of the plurality of memory cells are commonly connected thereto, an upper source line formed on an interlayer dielectric film on the semiconductor substrate and connected to the common source line via a through hole, and a second electrical connection path that connects the common source line and a ground voltage without through the upper source line when the common source line and the upper source line form a first electrical connection path and are connected to the ground voltage, wherein the second electrical connection path is formed using a first memory cell included in the plurality of memory cells.

A third aspect of the present invention is a memory device including a plurality of memory cells arranged in an array along a word line direction and a bit line direction, a common source line that commonly connects sources of the plurality of memory cells arranged along the word line direction, and a ground circuit that connects drains of the plurality of memory cells arranged along the bit line direction to a ground according to grounding of the common source line.

In the aspects of the present invention, the common source line and the ground voltage are connected further by the second electrical connection path formed using memory cells, and therefore the resistance of a source resistor can be reduced. It is thereby possible to achieve high-speed operation and suppress an increase in circuit area.

According to the present invention, it is possible to achieve high-speed operation without significant increase in circuit area.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Precondition Technique for the Invention

Prior to describing embodiments of the present invention, a memory device according to a precondition technique to which the present invention is applied is described hereinafter with reference to the drawings.

Figure 1:
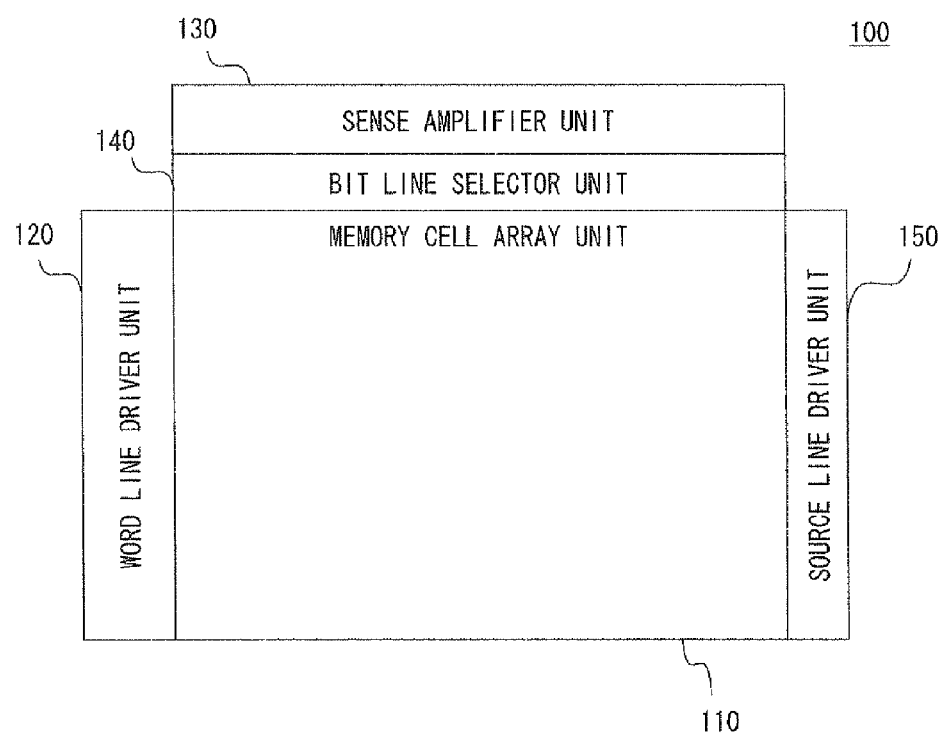
FIG. 1 is a block diagram showing a structure of a memory device according to a precondition technique for the present invention.
Figure 2:
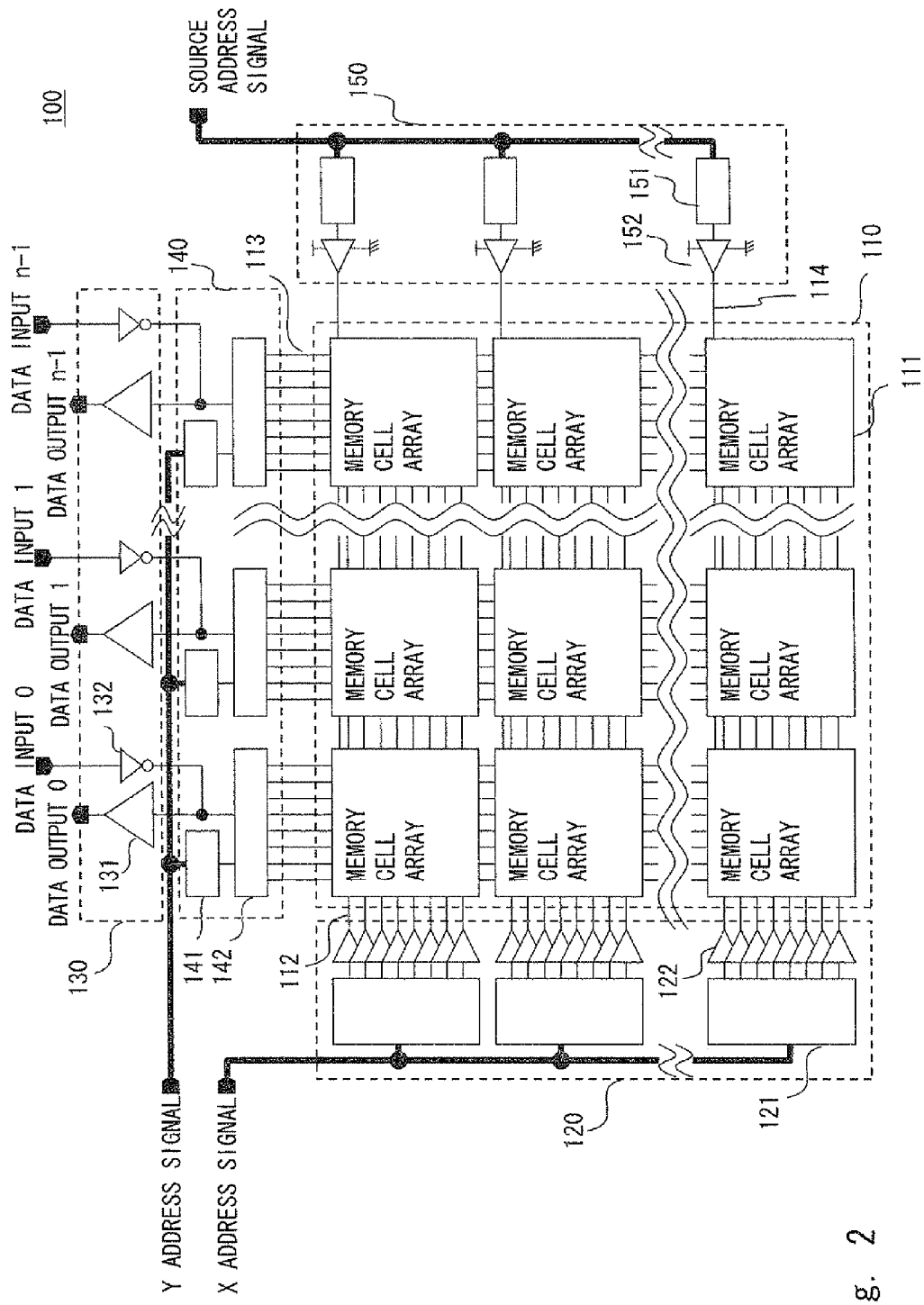
FIG. 2 is a circuit diagram showing a structure of the memory device according to the precondition technique for the present invention.

FIG. 1 shows a schematic structure of a memory device according to the precondition technique, and FIG. 2 shows a circuit structure of the memory device according to the precondition technique of FIG. 1.

As shown in FIGS. 1 and 2, a memory device 100 according to the precondition technique is a NOR (or DINOR) flash memory circuit and includes a memory cell array unit 110, a word line driver unit 120, a sense amplifier unit 130, a bit line selector unit 140, and a source line driver unit 150.

The memory cell array unit 110 includes a plurality of memory cell arrays 111. The plurality of memory cell arrays 111 are arranged in an array in the word line direction (which is the direction along which the word line lies; also called the x-direction) and the bit line direction (which is the direction along which the bit line lies; also called the y-direction). Further, each of the memory cell arrays 111 includes a plurality of memory cells and stores 8-bit×8-bit information, as described later.

Note that the number of bits of the memory cell array and the number of bit lines and word lines in each memory cell array are not limited to eight, and it may be any number. Further, the number of source lines in each memory cell array is also not limited to one, and it may be any number. Furthermore, the number of memory cell arrays and the number of inputs and outputs of data may be also set to any number.

The word line driver unit 120 includes a plurality of x-address decoders 121 and a plurality of word line drivers 122. The plurality of x-address decoders 121 are provided in units of the memory cell array 111 and, in this example, provided in units of eight bits, which is the same as the word line of the memory cell array 111.

The x-address decoder 121 is connected to the memory cell array 111 by a plurality of word lines 112 through the plurality of word line drivers 122. The x-address decoder 121 decodes an x-address signal input from an external control circuit and drives the word line 112 corresponding to the x-address signal by the word line driver 122. The word line driver 122 applies a high voltage of memory cells at the writing of memory cells, applies a negative voltage at the erasing of memory cells, and applies VDD at the reading of memory cells.

The sense amplifier unit 130 includes a plurality of sense amplifiers 131 and a plurality of write bit line drivers 132, and the bit line selector unit 140 includes a plurality of y-address decoders 141 and a plurality of bit line selectors 142.

The sense amplifiers 131, the write bit line drivers 132, the y-address decoders 141 and the bit line selectors 142 are provided in units of the memory cell array 111 and, in this example, provided in units of eight bits, which is the same as the bit line of the memory cell array 111.

The bit line selector 142 is connected to the memory cell array 111 by a plurality of bit lines 113 and switches a connection of the bit lines 113 of the memory cell array 111 with the sense amplifier 131 or the write bit line driver 132.

The y-address decoder 141 decodes a y-address signal input from an external control circuit and controls the bit line selector 142 to connect the bit line 113 corresponding to the y-address signal with the sense amplifier 131 or the write bit line driver 132.

The sense amplifier 131 is connected to a memory cell at the reading of memory cells, and amplifies the voltage of the memory cell and output a data output signal to the outside in order to detect the storage mode of the memory cell to be read.

The write bit line driver 132 is connected to a memory cell at the writing of memory cells, and drives the bit line 113 corresponding to the y-address signal in accordance with a data input signal in order to write data to the memory cell. The write bit line driver 132 is an inverter and applies VDD to the memory cell by inverting the data input signal.

The source line driver unit 150 includes a plurality of source decoders 151 and a plurality of source line drivers 152. The plurality of source decoders 151 and the plurality of source line drivers 152 are provided in units of the memory cell array 111. In this example, they are provided corresponding to a source line 114 of each memory cell array 111.

The source decoder 151 is connected to the memory cell array 111 by one source line 114 through the source line driver 152. The source decoder 151 decodes a source address signal input from an external control circuit and drives the source line 114 corresponding to the source address signal by the source line driver 152. The source line driver 152 makes switching to apply a high voltage at the writing of memory cells and connect a memory cell to GND at the reading or erasing of memory cells.

Figure 3:
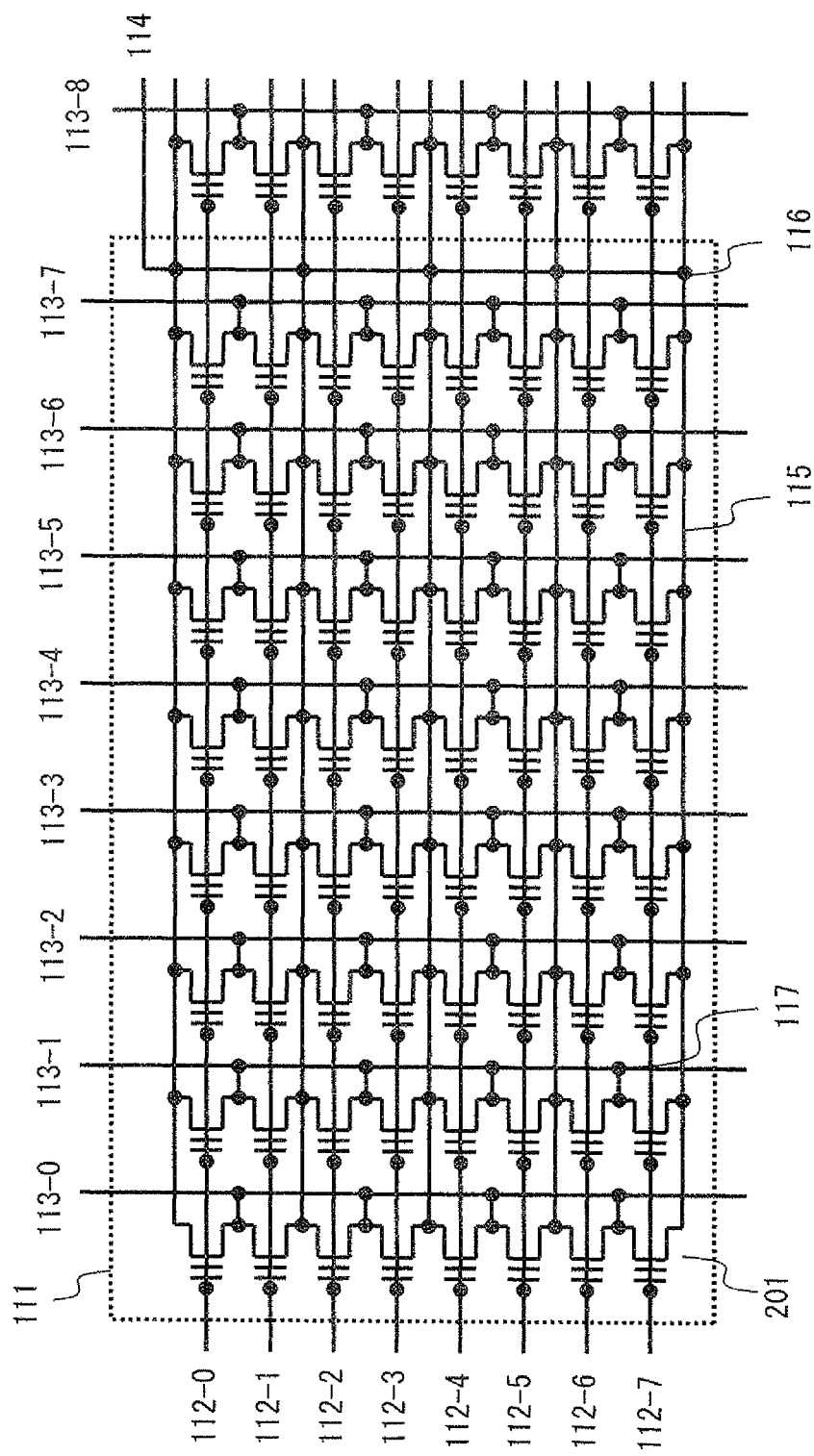
FIG. 3 is a circuit diagram showing a structure of a memory cell array according to the precondition technique for the present invention.

FIG. 3 shows a circuit structure of the memory cell array 111 according to the precondition technique. The memory cell array 111 is placed so that a plurality of word lines 112 and a plurality of bit lines 113 intersect with one another, and a plurality of memory cells 201 are arranged in an array at the intersections between the word lines 112 and the bit lines 113. Further, the source line 114 is led in the word line direction from the memory cells 201.

In this example, eight word lines 112 (112-0 to 112-7), eight bit lines 113 (113-0 to 113-7), and one source line 114 are provided.

In the plurality of memory cells 201 arranged along the word line direction, the gates of the respective memory cells 201 are commonly connected to one word line 112 in each row.

In the plurality of memory cells 201 arranged along the bit line direction, the drains of the respective memory cells 201 are commonly connected to one bit line 113 in each column. Each of the memory cells 201 is connected to the bit line 113 through a bit contact 117.

In the plurality of memory cells 201 arranged along the word line direction, the sources of the respective memory cells 201 are commonly connected to one common source line 115 in each row. Further, the memory cells 201 are connected from the common source line 115 to the source line 114 through a source contact 116. In this example, one source contact 116 is formed for every eight memory cells 201.

Figure 4A:
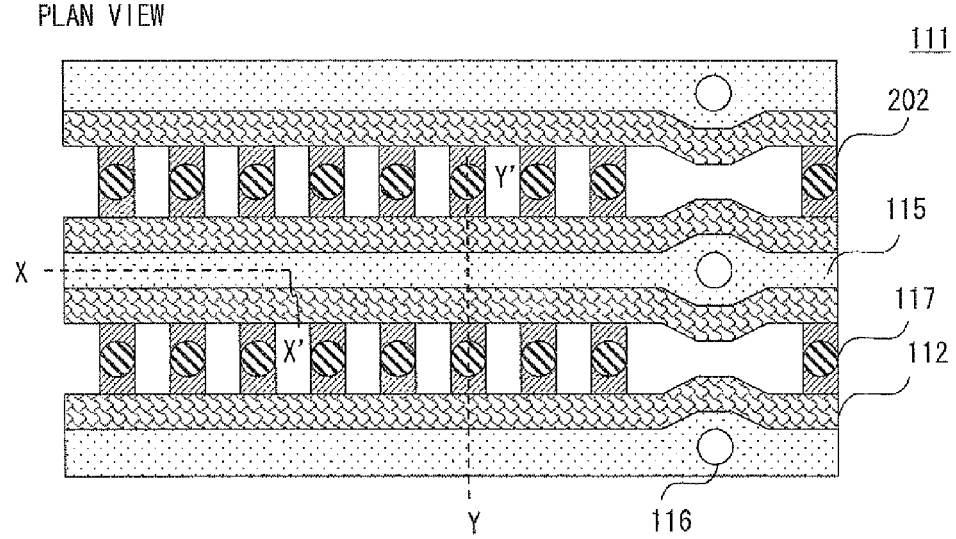
FIGS. 4A to 4C are diagrams showing a physical structure of a memory cell according to the precondition technique for the present invention.
Figure 4B:
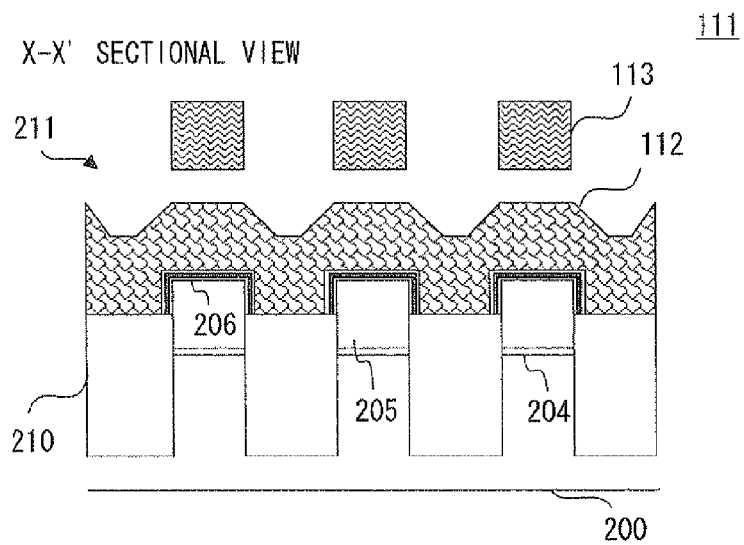
Figure 4C:
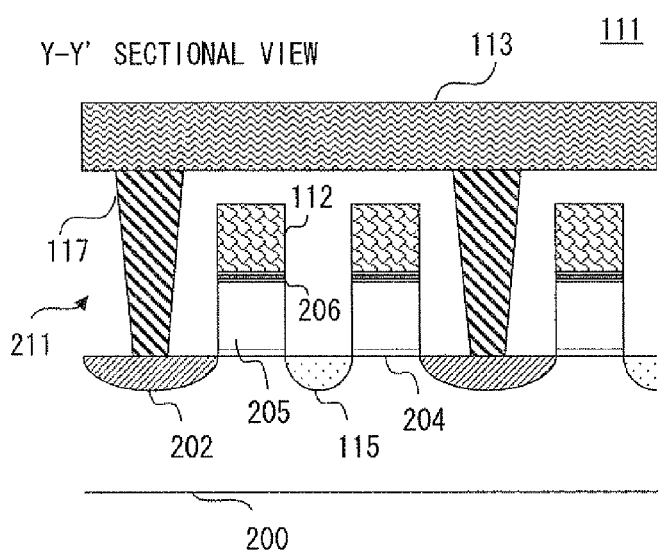

FIGS. 4A to 4C show a physical structure of the memory cell array 111 according to the precondition technique shown in FIG. 3. FIG. 4A is a plan view of the memory cell array 111, FIG. 4B is a cross-sectional view along line X-X' of FIG. 4A, and FIG. 4C is a cross-sectional view along line Y-Y' of FIG. 4A. Note that, in FIG. 4A, the bit line to which the bit contact is connected and the source line to which the source contact is connected are not shown.

As shown in FIGS. 4A to 4C, an isolation oxide film 210 is formed on the surface of a silicon substrate 200, and a source region 115 and a drain region 202 are formed separately from each other in the surface area of the silicon substrate 200 that is isolated by the isolation oxide film 210. The source region 115 is formed in a continuous pattern along the x-direction and commonly connected between adjacent memory cells to form the common source line 115.

On a channel region between the source region 115 and the drain region 202 of each memory cell, a floating gate 205 is formed with a gate oxide film 204 interposed therebetween. A selection gate 112 is formed with an inter-polysilicon dielectric film 206 interposed therebetween above the floating gate 205. The selection gate 112 lies in the x-direction and forms the word line 112.

On the stacked gate structure, an interlayer dielectric film 211 is formed, and the bit line 113 is formed on the interlayer dielectric film 211 along the y-direction. Further, the source line (upper source line) 114 is formed on the interlayer dielectric film 211 along the y-direction, though not shown.

The bit line 113 is connected to the drain region 202 by the bit contact 117 via a through hole penetrating the interlayer dielectric film 211. The bit contact 117 is formed for each memory cell as in FIG. 3.

The source line 114 is also connected to the source region (common source line) 115 by the source contact 116 via a through hole penetrating the interlayer dielectric film 211. Because the area of several cells is required to form the source contact 116, the source contact 116 is formed for every eight memory cells as in FIG. 3 in this example.

A data write operation in the memory device according to the precondition technique is described hereinafter with reference to FIGS. 5, 6A and 6B.

Figure 5:
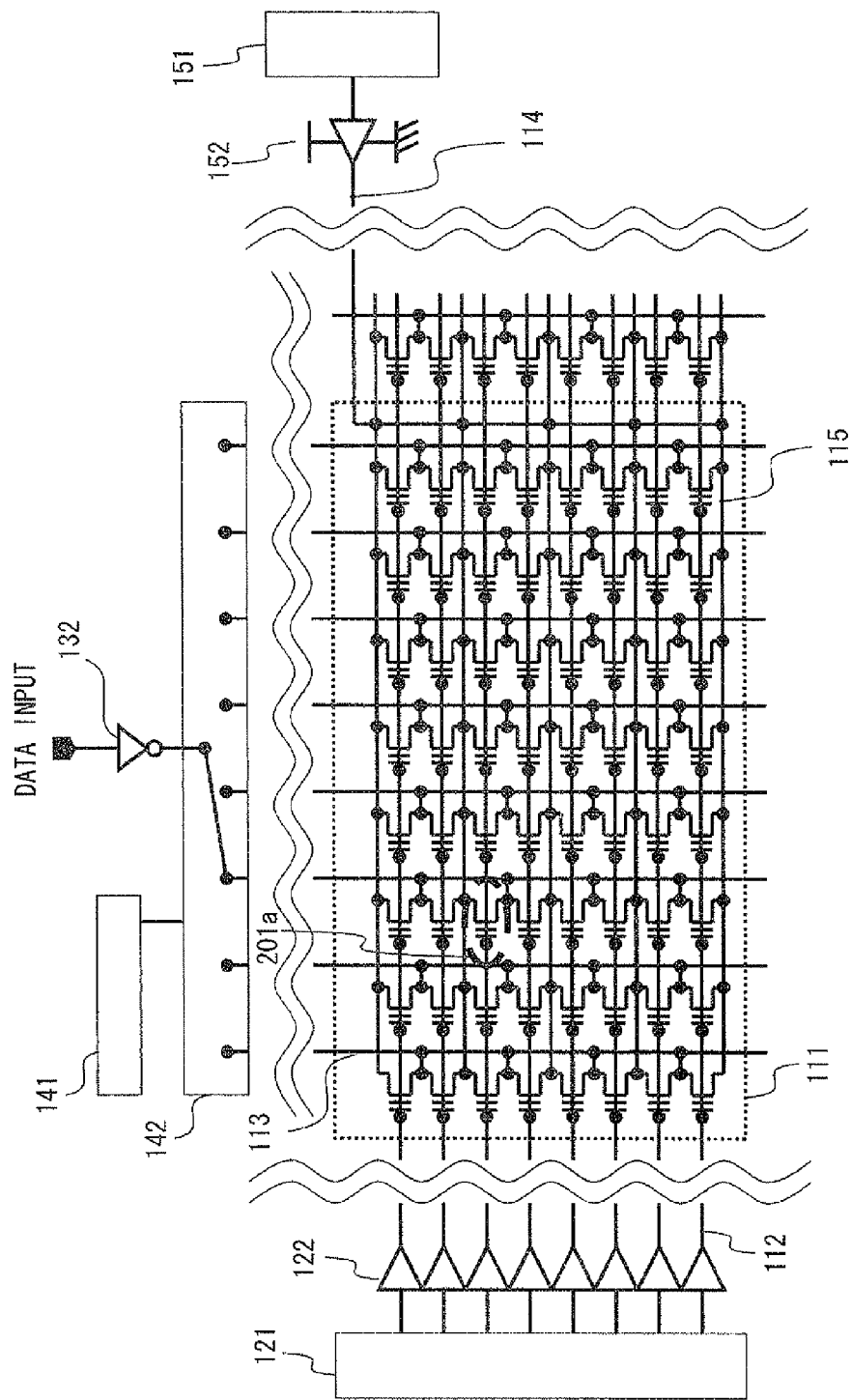
FIG. 5 is a diagram illustrating an operation of the memory device according to the precondition technique for the present invention.

As shown in FIG. 5, when writing data to the memory cell 201, a y-address signal is first input to the y-address decoder 141. The y-address decoder 141 decodes the y-address signal and switches the bit line selector 142 so as to connect the bit line 113 connected to a memory cell 201a to be written and the write bit line driver 132.

Further, a source address signal is input to the source decoder 151. The source decoder 151 decodes the source address signal, and the source line driver 152 applies a high voltage to the source line 114 in a region (memory cell array 111) where the memory cell 201a to be written is located.

As the potential of the bit line 113, GND is applied to the cell where 0 data is to be written, and VDD is applied to the cell where 1 data is to be written (i.e. the cell where data is not written). Thus, the bit line 113 is applied a voltage generated by inverting input data by the write bit line driver 132.

At this stage, a voltage is not yet applied to the gate 112 through the word line 112, and therefore no current flows into the memory cell 201a. FIGS. 6A and 6B show the state of the memory cell 201a at this time.

Figure 6A:
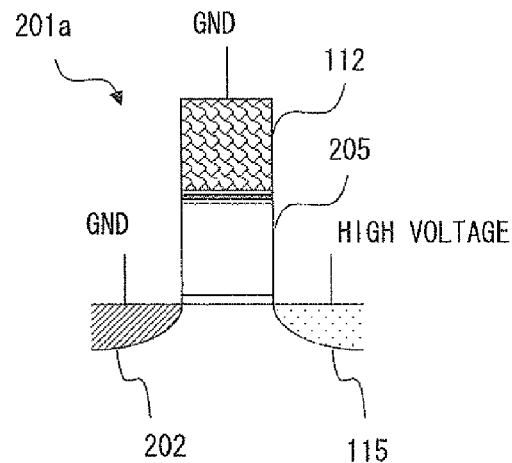
FIGS. 6A and 6B are diagrams an operation of the memory device according to the precondition technique for the present invention.

As shown in FIG. 6A, when writing 0 data to the memory cell 201a, the drain 202 is set to GND by the bit line 113, a high voltage is applied to the source 115 by the source line 114, and the gate 112 is GND at this time.

Figure 6B:
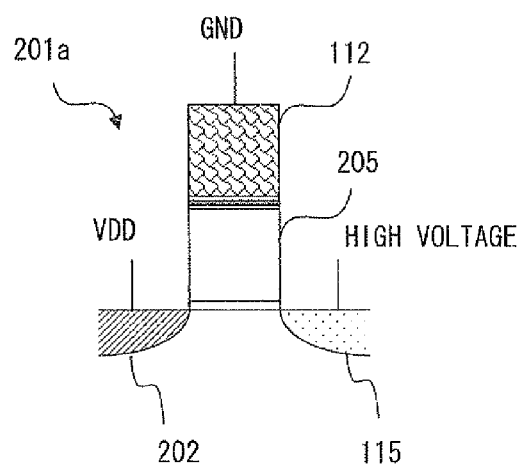

Further, as shown in FIG. 6B, when writing 1 data (when not writing data) to the memory cell 201a, VDD is supplied to the drain 202 by the bit line 113, a high voltage is applied to the source 115 by the source line 114, and the gate 112 is GND at this time.

Figure 7:
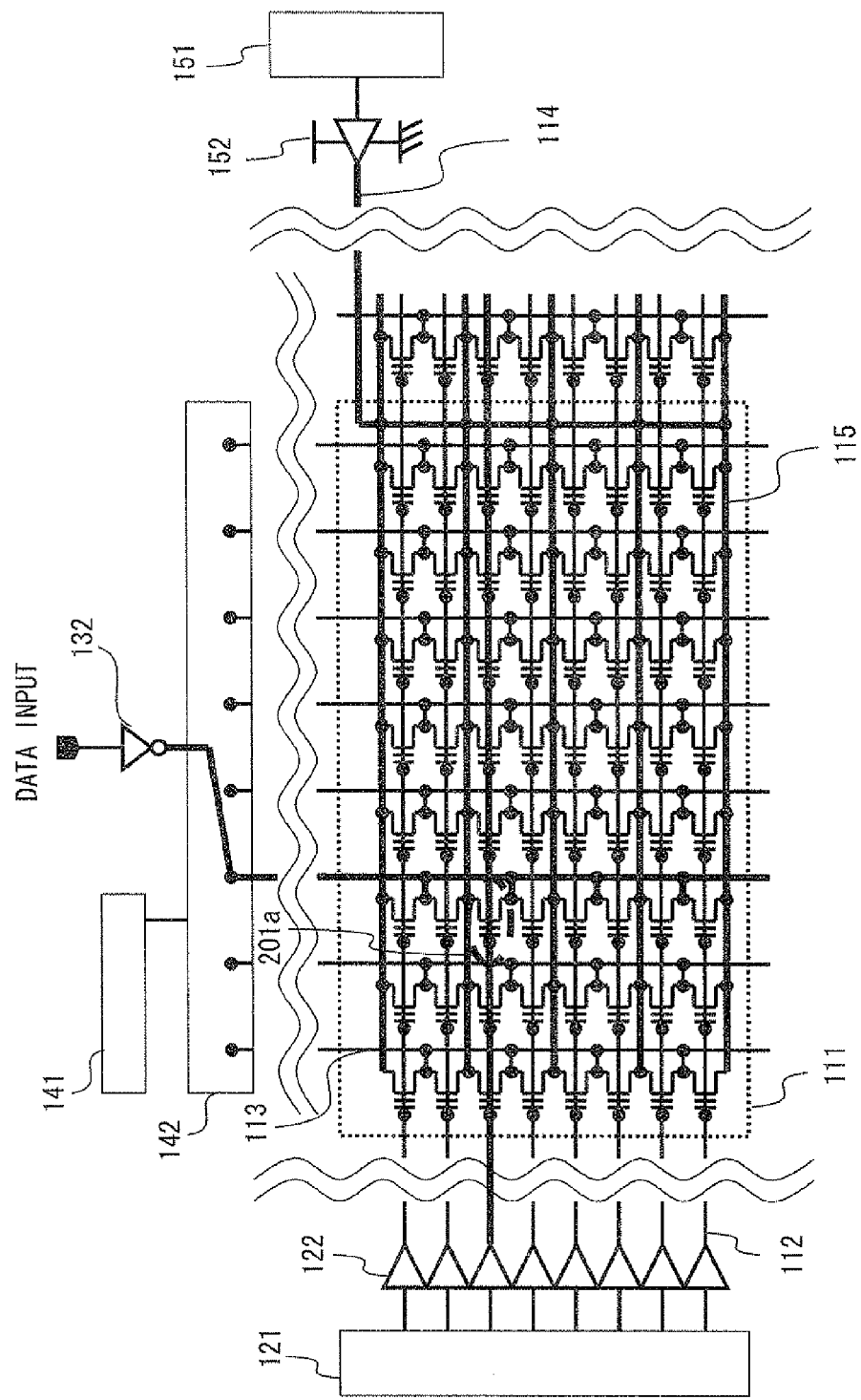
FIG. 7 is a diagram illustrating an operation of the memory device according to the precondition technique for the present invention.
Figure 8A:
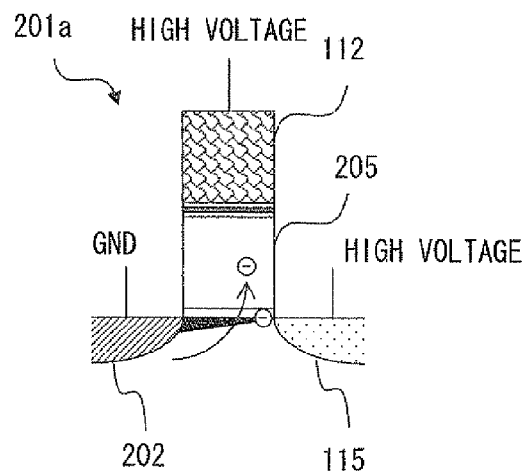
FIGS. 8A and 8B are diagrams an operation of the memory device according to the precondition technique for the present invention.
Figure 8B:
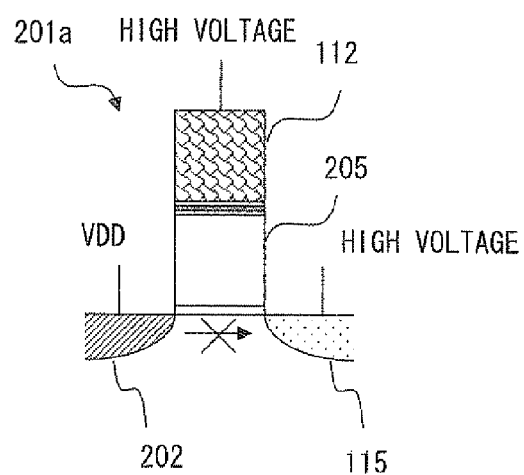

Then, as shown in FIG. 7, an x-address signal is input to the x-address decoder 121. The x-address decoder 121 decodes the x-address signal, and the word line driver 122 applies a high voltage to the word line 112 that is connected to the memory cell 201a to be written corresponding to the x-address. FIGS. 8A and 8B show the state of the memory cell 201a at this time.

As shown in FIG. 8A, for the memory cell 201a where 0 data is to be written, a high voltage is applied to the gate 112 by the word line 112. Then, current flows from the source 115 to the drain 202 in the memory cell 201a, and electrons (channel hot electrons) having high energy that are generated in the channel of the memory cell 201a are accelerated by the high voltage of the gate 112 and injected into the floating gate 205, and thereby data is written.

Further, as shown in FIG. 8B, for the memory cell 201a where 1 data is to be written, a high voltage is applied to the gate 112 by the word line 112. Because the drain 202 is raised to VDD by the bit line 113 in the memory cell 201a, no current flows between the source and the drain, and data is not written to the memory cell 201a.

A data erase operation in the memory device according to the precondition technique is described hereinafter with reference to FIG. 9.

Figure 9:
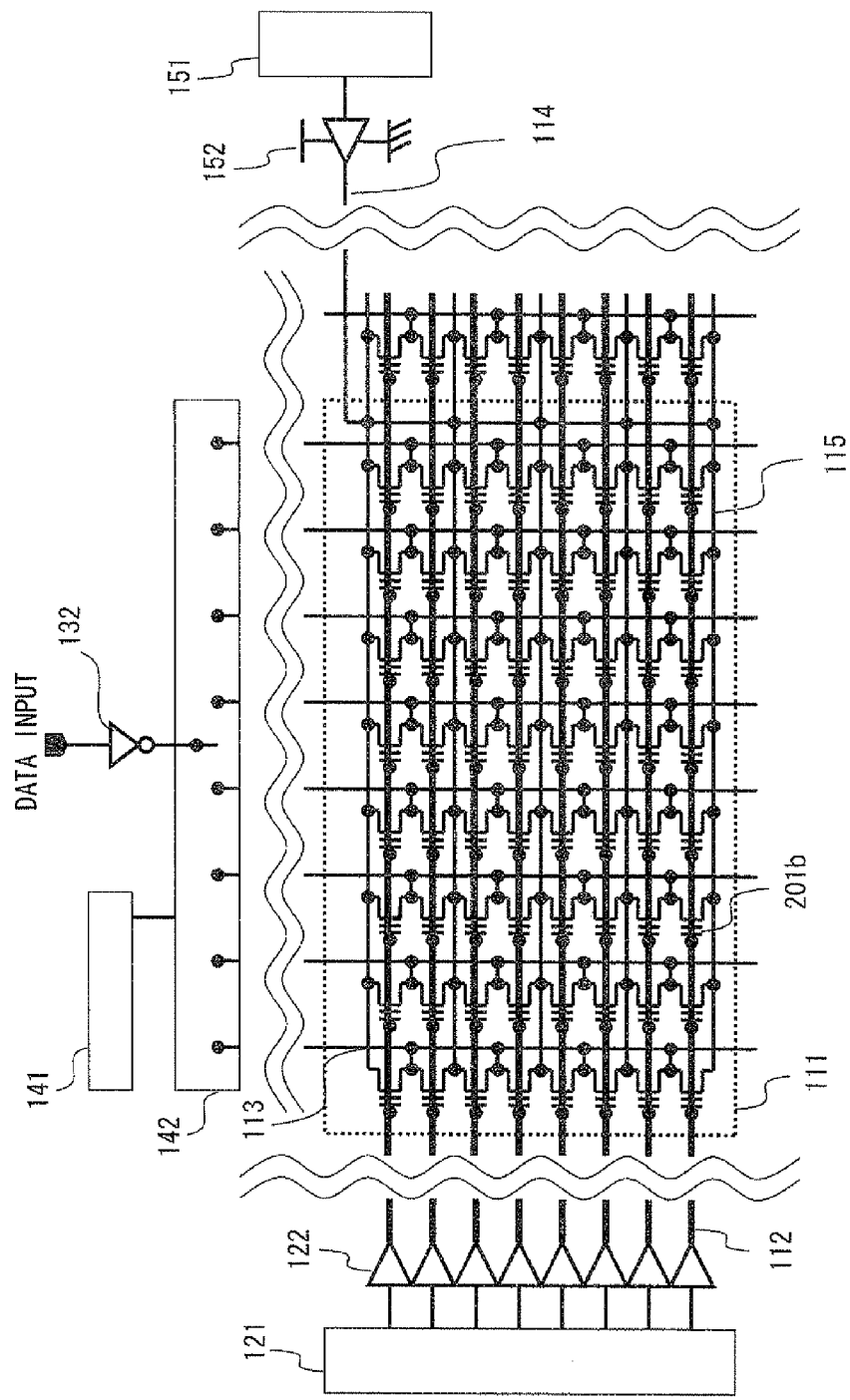
FIG. 9 is a diagram illustrating an operation of the memory device according to the precondition technique for the present invention.
Figure 10:
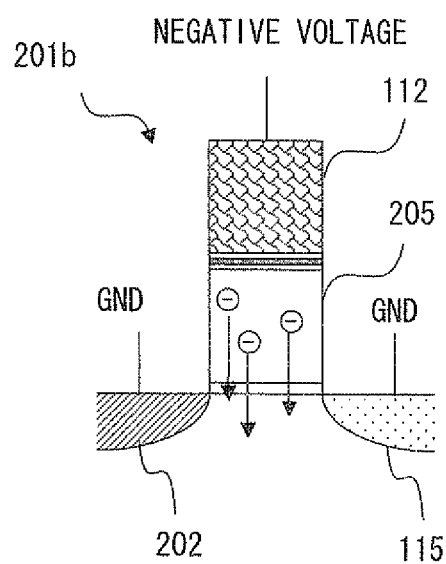
FIG. 10 is a diagram illustrating an operation of the memory device according to the precondition technique for the present invention.

As shown in FIG. 9, when erasing data of the memory cell 201, the potential of the bit line 113 is set to GND, the potential of the source line 114 is set to GND, and a negative high voltage is applied to the word line 112 that is connected to a memory cell 201b to be erased. FIG. 10 shows the state of the memory cell 201b at this time.

As shown in FIG. 10, in the memory cell 201b, the drain 202 is set to GND by the bit line 113, the source 115 is set to GND by the source line 114, and a negative high voltage is applied to the gate 112 by the word line 112.

Then, electrons accumulated in the floating gate 205 are discharged to the silicon substrate 200 by Fowler-Nordheim (FN) tunneling phenomenon. Although all of the memory cells 201b connected in common to the word line 112 are erased, this raises no problem because in no case a specific memory cell is erased in the NOR flash memory. Further, a y-address is not required for erasing.

A data read operation in the memory device according to the precondition technique is described hereinafter with reference to FIG. 11.

Figure 11:
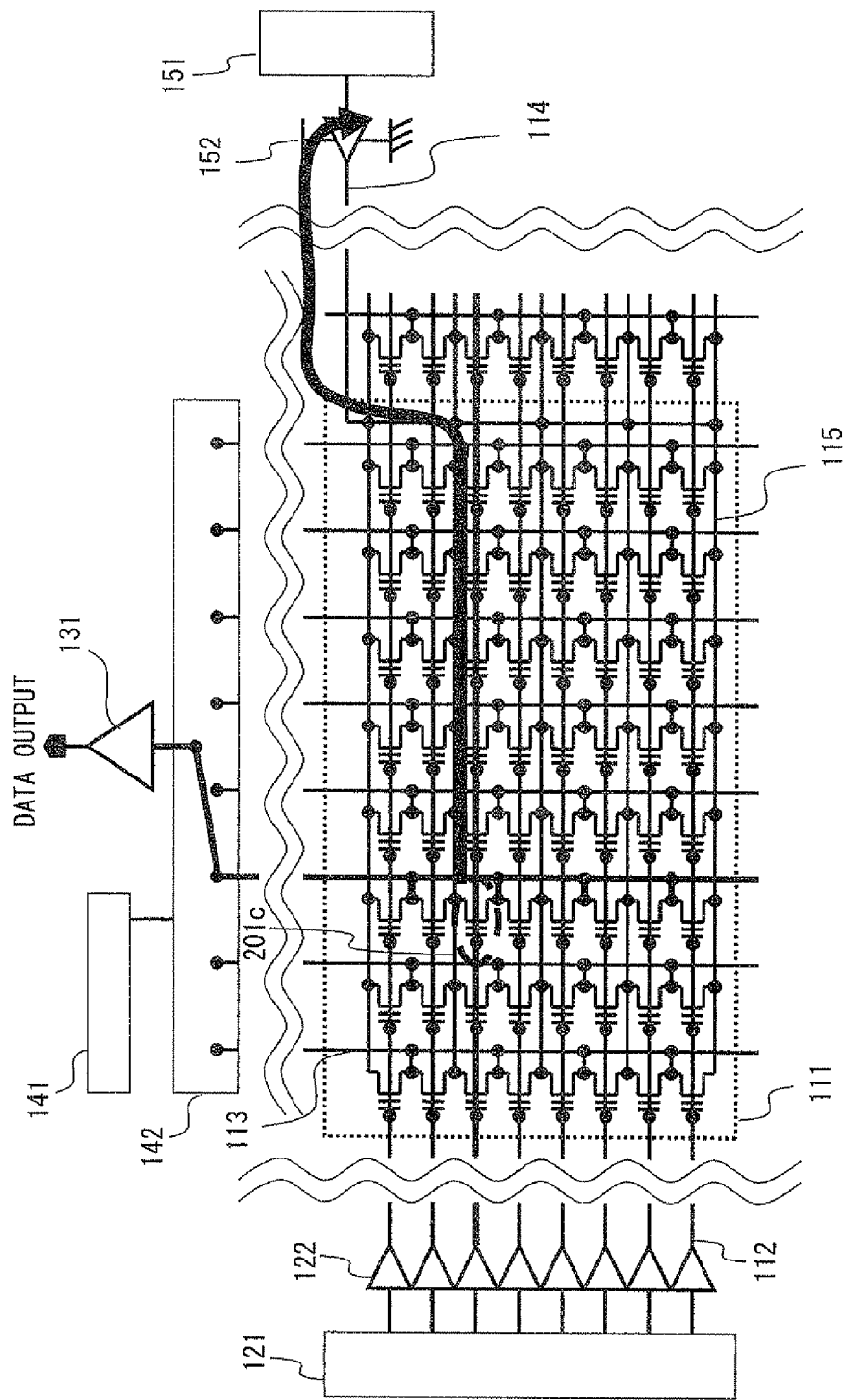
FIG. 11 is a diagram illustrating an operation of the memory device according to the precondition technique for the present invention.
Figure 12A:
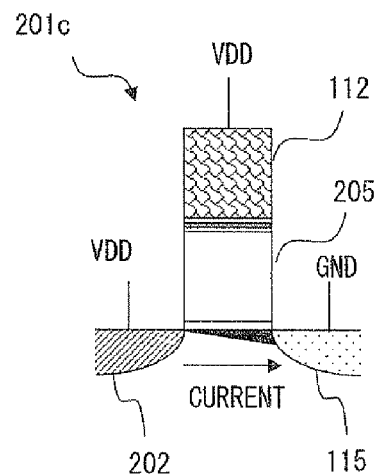
FIGS. 12A and 12B are diagrams an operation of the memory device according to the precondition technique for the present invention.
Figure 12B:
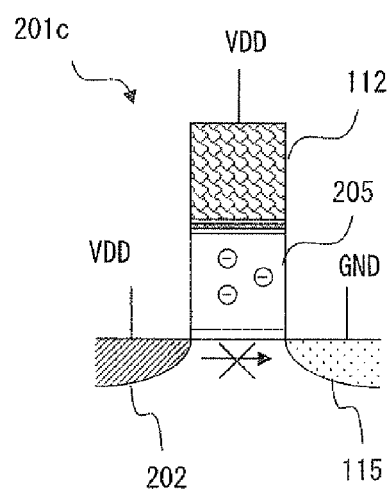

As shown in FIG. 11, when reading data, a y-address signal is input to the y-address decoder 141. The y-address decoder 141 decodes the y-address signal and switches the bit line selector 142 so as to connect the bit line 113 connected to a memory cell 201c to be read and the sense amplifier 131. Further, an x-address signal is input to the x-address decoder 121. The x-address decoder 121 decodes the x-address signal and applies a voltage to the word line 112 that is connected to the memory cell 201c to be read. Further, the common source line 115 and the source line 114 are grounded to GND by the source line driver 152. Then, current flows from the memory cell 201c to GND via the path through the common source line 115 and the source line 114 in accordance with the storage mode of the memory cell 201c to be read. FIGS. 12A and 12B shows the state of the memory cell 201c at this time.

As shown in FIGS. 12A and 12B, when reading data of the memory cell 201c, the source 115 is set to GND by the source line 114, VDD is supplied to the gate 112 by the word line 112, and VDD is applied from the sense amplifier 131 to the drain 202 by the bit line 113.

Then, when the memory cell 201c to be read is "1" which is a non-write state, no charge is accumulated in the floating gate 205 as shown in FIG. 12A, and therefore an inversion layer is formed at the interface of the silicon substrate 200 due to the electric field of the gate 112, and current flows from the drain 202 to the source 115 and flows into GND through the source line 114. The sense amplifier 131 detects this current and thereby reads the non-write state (data 1).

Further, when the memory cell 201c to be read is "0" which is a write state, the voltage applied to the gate 112 is blocked by electrons in the floating gate 205 and does not reach the silicon substrate 200, and therefore no current flows between the drain and the source. The sense amplifier 131 detects the absence of current and thereby reads the write state (data 0).

As described above, in the structure of the precondition technique, the common source line that commonly connects the sources of a plurality of memory cells is provided, and a connection is made to the source line from the coimmon source line through the source contact.

Figure 13:
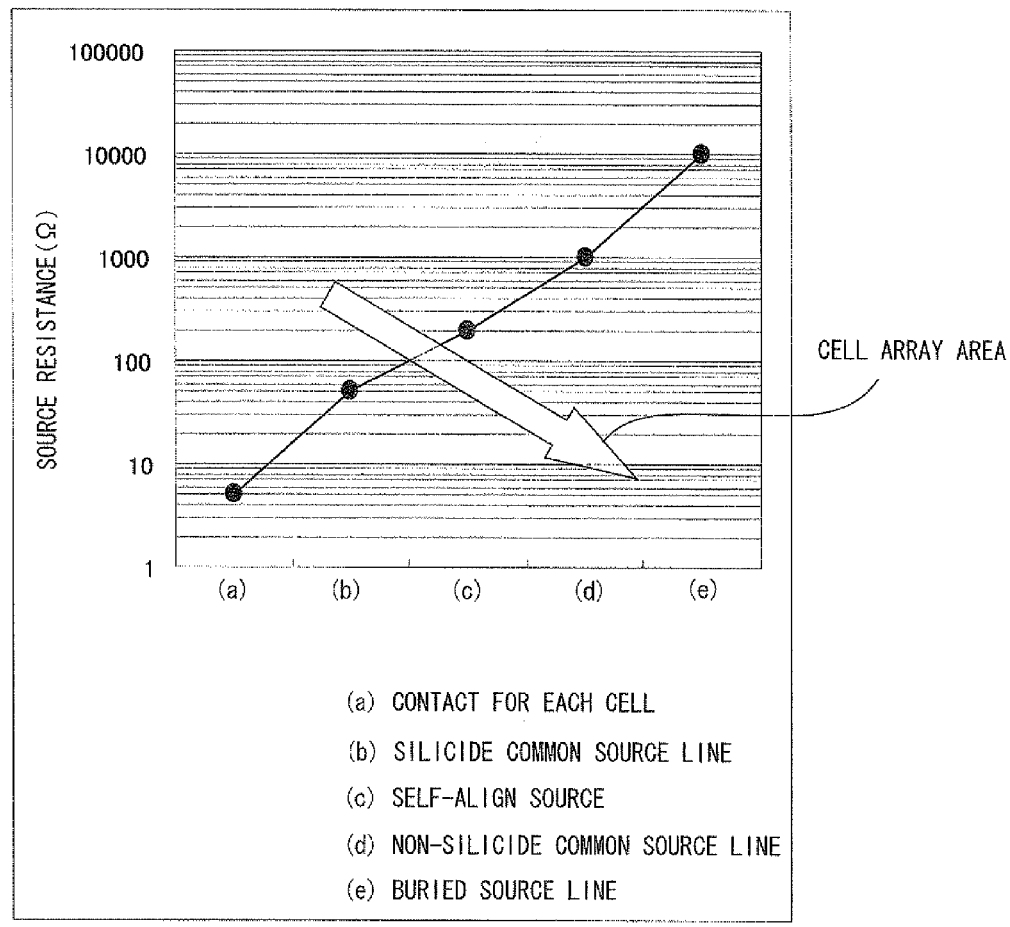
FIG. 13 is a diagram illustrating characteristics of the memory device according to the precondition technique for the present invention.

A problem of the precondition technique is as follows. FIG. 13 shows the relationship between the structure of a plurality of memory cells including the precondition technique and source resistance.

In FIG. 13, the structure of "(a) contact for each cell" is a structure in which the source contact is provided for each memory cell, and a connection is made from the source of each memory cell to the source line.

The structure of "(b) silicide common source line" is a structure in which the source of each memory cell is connected by silicide (metal), the common source line is formed using this silicide, and a connection is made from this silicide common source line in units of a plurality of memory cells to the source line through the source contact.

The structure of "(c) self-align source" is a structure in which the common source line is formed using silicon, in contrast to the structure of the "silicide common source line".

The structure of "(d) non-silicide common source line" is a structure in which the common source line is formed using non-silicide that does not contain metal because silicide cannot be formed in the source region because of the fine manufacturing process, in contrast to the structure of the "silicide common source line".

The structure of "(e) buried source line" is a structure in which the common source line is formed using non-silicide in a region of an auxiliary electrode such as an erase gate or a region under a dielectric film because of the still finer manufacturing process, in contrast to the structure of the "non-silicide common source line"

Recently, as the manufacturing process becomes finer, the structure of memory cells has made progress from the structure (a) to the structure (e). With the progress from the structure (a) to the structure (e), the cell array area is decreasing.

First, comparing the structure (a) with the structures (b) and (c), the structures (b) and (c) are the structure having the common source line in which the sources of the respective memory cells are commonly connected and the source contact is provided at intervals of a plurality of memory cells, so that the cell array area is smaller than that of the structure (a).

However, as shown in FIG. 13, because the common source line has higher line resistance than the source line, the source resistance increases with use of the common source line.

Further, comparing the structures (b) and (c) with the structures (d) and (e), the area is still smaller in the structures (d) and (e) than in the structures (b) and (c) by the finer manufacturing process. However, because the source cannot be formed using silicide in the structures (d) and (e) due to the fine manufacturing process, the source resistance significantly increases.

Figure 14:
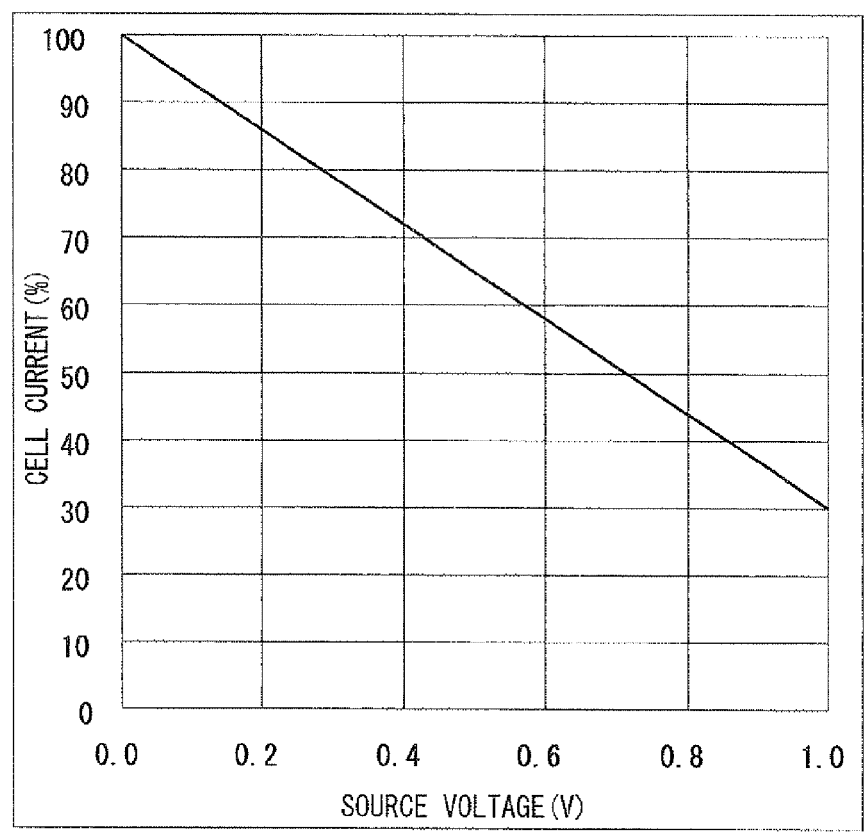
FIG. 14 is a diagram illustrating characteristics of the memory device according to the precondition technique for the present invention.

The increase in source resistance largely affects cell current flowing into memory cells. FIG. 14 shows the relationship between the source voltage and the cell current in memory cells. When the source resistance increases, the source voltage rises accordingly. Then, the cell current becomes lower with the rise of the source voltage as shown in FIG. 14.

Thus, when the source resistance increases, the source voltage cannot be reduced to the ground voltage at the reading of memory cells, and the cell current decreases due to the back-gate effect. As the cell current is higher, reading can be done at higher speed, and therefore the decrease in cell current means a decrease in reading speed.

Although one way to reduce the source resistance is to increase the number of source contacts, because a source contact region generally occupies the area that is several times the size of a normal cell, increasing the number of source contacts results in significant reduction of the effective cell area with respect to the whole cell array area.

As described above, although the common source line technique is effective in order to increase the cell density of the NOR flash memory, the source resistance increases and the cell current decreases with use of the technique that is advantageous for the cell density. Further, although it is effective to increase the number of source contacts in order to reduce the source resistance, the cell density is reduced accordingly. Thus, the cell density and the source line resistance are in the trade-off relationship.

In view of the above, according to embodiment of the present invention, a discharge path of the source to the ground is created separately to thereby achieve both increase of the cell density and decrease of the source line resistance, as described hereinbelow. Particularly, for cells in the erase mode, the principle to perform the same operation as a typical MOSFET, such as turning off when a voltage is not applied to the gate and turning on when a voltage is applied, is used, so that a plurality of paths for the source current can be formed to avoid a significant increase in circuit area.

Features of the Invention

Prior to describing embodiment of the present invention, the main features of the invention are described hereinafter in comparison with reference examples.

Figure 15:
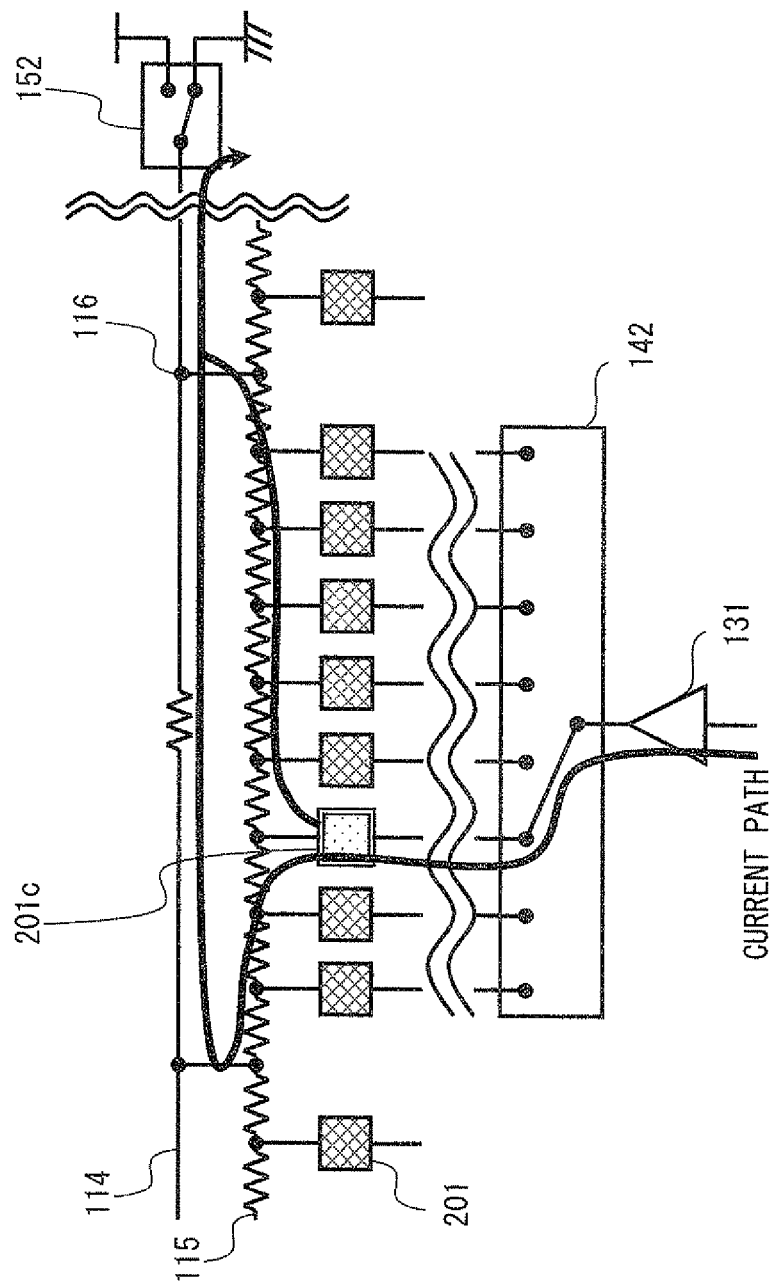
FIG. 15 is a diagram illustrating an outline of the memory device according to the precondition technique for the present invention.

First, FIG. 15 is a schematic diagram at the reading in a memory device according to a reference example. In the reference example, the sense amplifier 131 is connected to the memory cell 201c to be read by the bit line selector 142, and the memory cell 201c to be read is grounded by the source line driver 152 through the common source line 115, the source contact 116 and the source line 114. The source line 114 is a metal line and has low resistance, and the common source line 115 is a diffusion layer line and has high resistance.

In the reference example, because the diffusion layer line (common source line) with high resistance exists in the path from the source of a memory cell to the ground, the amount of current is restricted. As the amount of current is larger, the reaction of the sense amplifier 131 is faster, and therefore the resistance needs to be reduced for higher-speed read operation. To achieve this, however, it is necessary to provide a large number of diffusion layer—metal line connection (source contact) regions that require a large area, which causes an increase in the area of the memory cell array.

Figure 16:
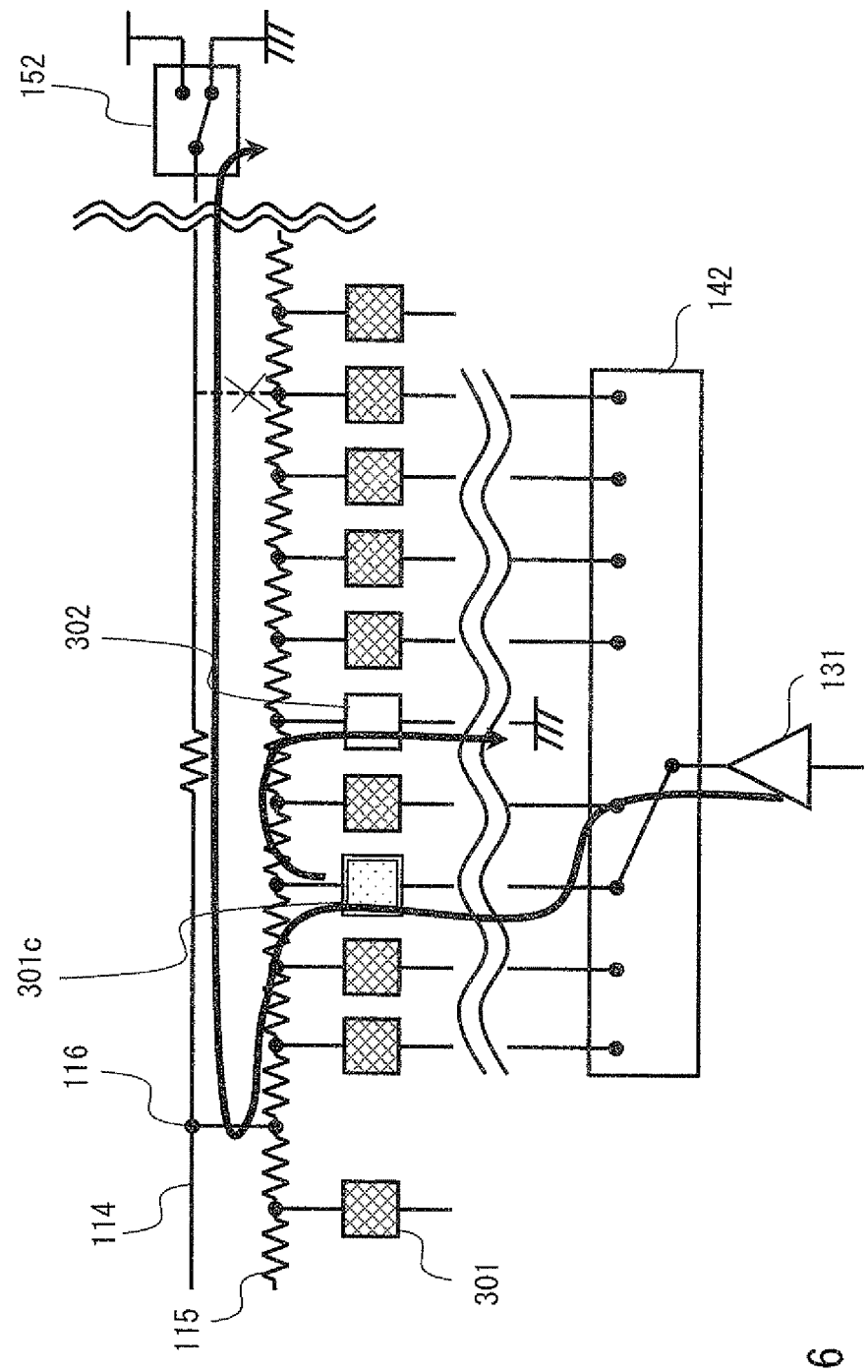
FIG. 16 is a diagram illustrating an outline of a memory device according to the present invention.

On the other hand, FIG. 16 is a schematic diagram at the reading in a memory device according to one embodiment of the invention. In the present invention, a memory cell 302 that is always in the erase mode is used as the ground path to GND. Specifically, as in the reference example, the sense amplifier 131 is connected to a memory cell 301c to be read by the bit line selector 142, and the memory cell 301c (second memory cell) to be read is grounded by the source line driver 152 by a first electrical connection path through the common source line 115, the source contact 116 and the source line 114. In one embodiment of this invention, the memory cell 301c is also grounded by a second electrical connection path through the memory cell 302 (first memory cell) connected in common to the common source line 115.

In this manner, according to one embodiment of the invention, cell current is connected to GND not only through the common source line but also through the memory cell 302, and it is thereby possible to reduce the source resistance and suppress an increase in the source voltage to enable high-speed operation. Further, because the connection is made to GND using a memory cell in the memory cell array rather than a source contract, it is thereby possible to reduce the frequency of placement of source contacts and thereby suppress an increase in circuit size.

First Embodiment of the Invention

Figure 17:
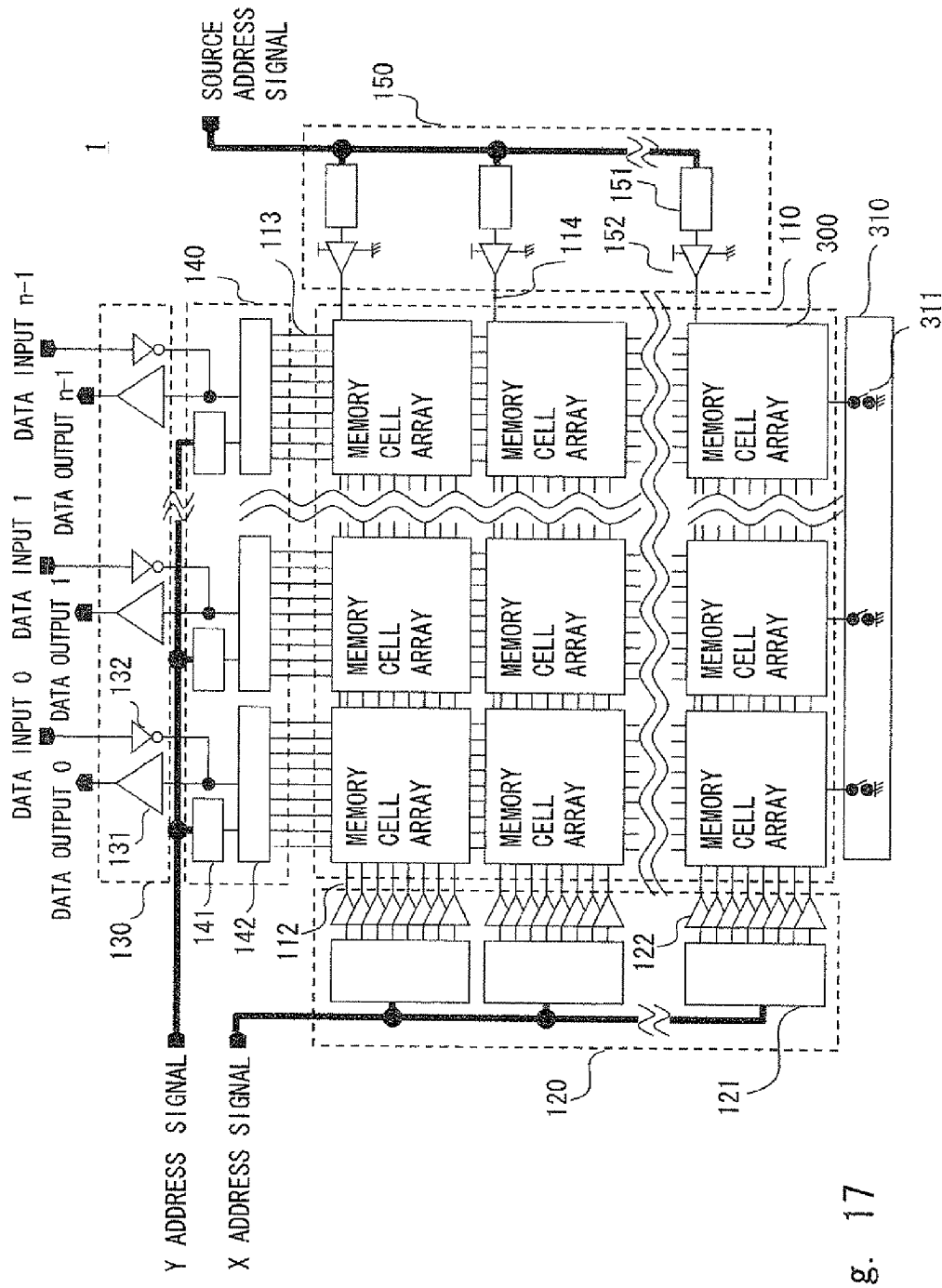
FIG. 17 is a circuit diagram showing a structure of a memory device according to a first embodiment of the present invention.

A first embodiment of the invention is described hereinafter with reference to the drawings. FIG. 17 shows a structure of a memory device according to the first embodiment of the invention.

A memory device 1 according to this embodiment is a NOR (DINOR) flash memory circuit and includes the word line driver unit 120, the sense amplifier unit 130, the bit line selector unit 140 and the source line driver unit 150, which is the same as shown in FIGS. 1 and 2. On the other hand, the memory device 1 includes the memory cell array unit 110 that has a different structure from that of FIGS. 1 and 2, and it further includes a bit line grounding switch unit 310.

The memory cell array unit 110 includes a plurality of memory cell arrays 300, and each of the memory cell arrays 300 includes a plurality of memory cells and stores 8-bit×8-bit information, as described later, and further has erase-mode memory cells (memory cells 302, which are described later) that are always in the erase mode. The erase-mode memory cells are placed on a specific bit line 113 (bit line 113-G, which is described later), and the specific bit line 113 is connected to the bit line grounding switch unit 310. Although the specific bit line 113 is extended to the bit line selector 142, it is not electrically connected to the bit line selector 142.

The bit line grounding switch unit 310 includes a plurality of bit line grounding switches 311. The plurality of bit line grounding switches 311 are provided for each erase-mode memory cell of the memory cell array 300 and connected to the erase-mode memory cell by the bit line 113. The bit line grounding switch 311 is turned on at the reading of a memory cell and thereby connects the erase-mode memory cell to GND.

Figure 18:
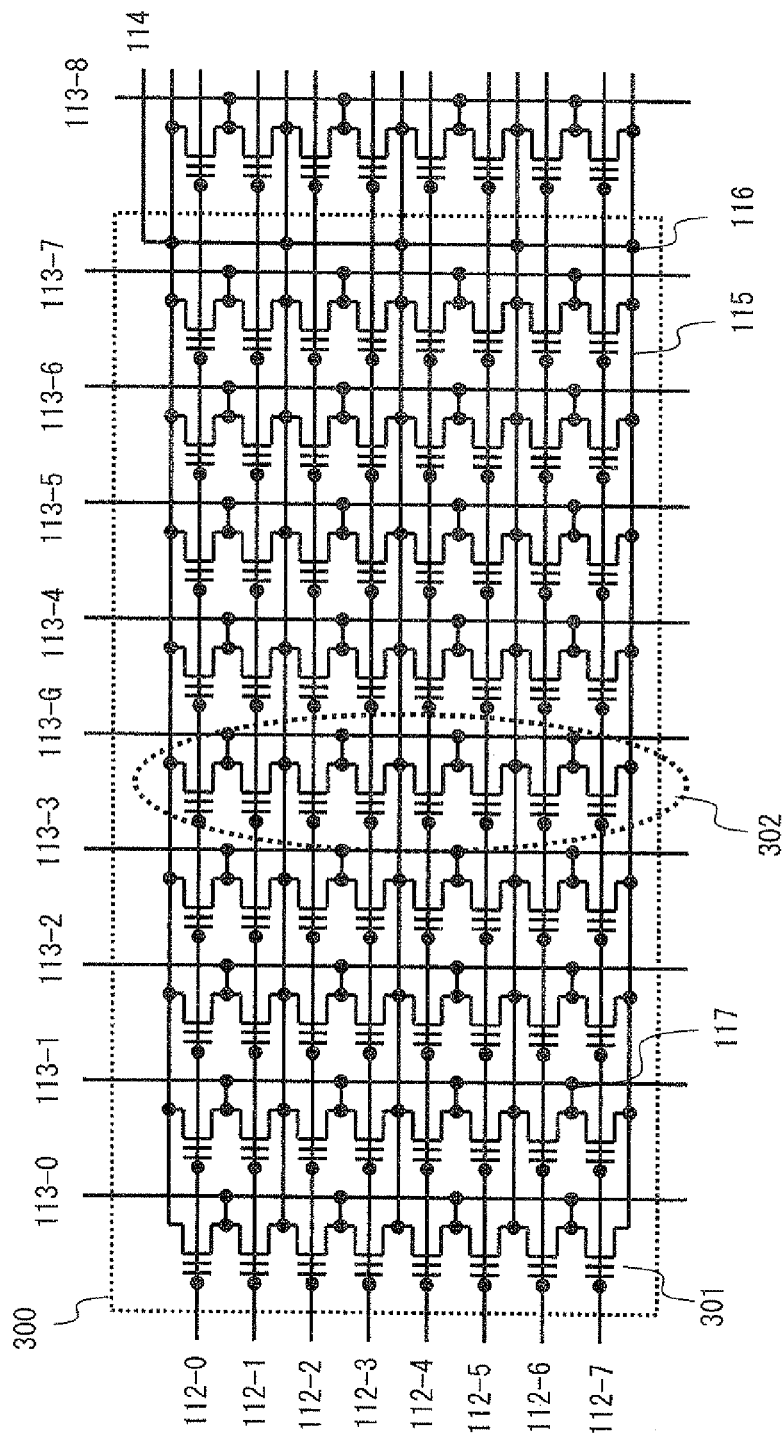
FIG. 18 is a circuit diagram showing a structure of a memory cell array according to the first embodiment of the present invention.

FIG. 18 shows a circuit structure of the memory cell array 300 according to the first embodiment of the invention.

In the memory cell array 300, memory cells 301, which are NOR flash memory cells, are arranged in an array as in FIG. 3, and the source line 114 is connected to each memory cell 301 through the word line 112, the bit line 113 and the common source line 115. The memory cell array 300 includes a plurality of erase-mode memory cells 302 that are always in the erase mode and connected to the bit line 113-G, differently from FIG. 3. The erase-mode memory cells 302 are always in the erase mode and connected to the bit line grounding switch 311. As the erase-mode memory cells 302, memory cells connected to an arbitrary bit line 113 may be used. Further, the erase-mode memory cell 302 has the same structure as the other memory cells and thus has the same physical structure as shown in FIGS. 4A to 4C.

A data write operation in the memory device 1 according to the first embodiment of the invention is described hereinafter with reference to FIG. 19.

The write operation of the memory device 1 is the same as shown in FIG. 5. Specifically, a y-address signal is input to the y-address decoder 141, and the bit line selector 142 connects the bit line 113 connected to a memory cell 301a to be written and the write bit line driver 132. Further, a source address signal is input to the source decoder 151, and the source line driver 152 applies a high voltage to the source line 114 in a region where the memory cell 301a to be written is located. Furthermore, an x-address signal is input to the x-address decoder 121, and the word line driver 122 applies a high voltage to the word line 112 that is connected to the memory cell 301a to be written. Data is thereby written to the memory cell 301a as shown in FIGS. 8A and 8B.

In this embodiment, the bit line 113-G to which the erase-mode memory cells 302 that are always in the erase mode are connected is not connected to the bit line selector 142 and the write bit line driver 132, and therefore the erase-mode memory cells 302 are not selected by the bit line selector 142 at any time. Further, during writing, the bit line grounding switch 311 is off, and the erase-mode memory cells 302 are separated from GND by the switch.

Therefore, electrons are not injected into the erase-mode memory cells 302 on the bit line 113-G and remain in the erase mode during writing. Further, address information is not needed for the bit line grounding switch 311 and it can have a simple structure.

A data erase operation in the memory device according to the first embodiment of the invention is described hereinafter with reference to FIG. 20.

The erase operation of the memory device 1 is the same as shown in FIG. 9. Specifically, when erasing data of the memory cell 301, the potential of the bit line 113 is set to GND, the potential of the source line 114 is set to GND, and a negative high voltage is applied to the word line 112 that is connected to a memory cell 301b to be erased. The data of the memory cell 301b on the word line 112 is thereby erased as shown in FIG. 10.

At this time, the bit line grounding switch 311 is off. Further, because the memory cell 301b to be erased is decided by the x-address only, the erase-mode memory cell 302 is also erased when the memory cell 301b is erased. Because the erase-mode memory cell 302 should be always in the erase mode, there is no effect on the operation of the invention even when the erase-mode memory cell 302 is erased at the same time as the memory cell 301b.

A data read operation in the memory device according to the first embodiment of the invention is described hereinafter with reference to FIG. 21.

When reading data, a y-address signal is input to the y-address decoder 141, and the y-address decoder 141 decodes the y-address signal and switches the bit line selector 142 so as to connect the bit line 113 connected to a memory cell 301c to be read and the sense amplifier 131. Further, an x-address signal is input to the x-address decoder 121, and the x-address decoder 121 decodes the x-address signal and applies a voltage to the word line 112 that is connected to the memory cell 301c to be read. Further, the common source line 115 and the source line 114 are grounded to GND by the source line driver 152.

At this time, in this embodiment, the bit line grounding switch 311 turns on to connect the erase-mode memory cells 302 to GND. When reading data, the erase-mode memory cells 302c that are always in the erase mode become the on-state at the same time when a voltage is applied to the word line 112. The bit line grounding switch 311 is controlled by an external control circuit so as to turn on at least during reading of memory cells. For example, the bit line grounding switch 311 is turned on at the timing when the source line driver 152 connects the source line 114 to the ground by the source decoder 151.

Therefore, the current that has flowed from the sense amplifier 131 into the common source line 115 through the memory cell 301c to be read flows out to GND not only by the path to the source line driver 152 but also by the path through the erase-mode memory cells 302c that are always in the erase mode. Specifically, the memory cell 301c is grounded by two paths: a first electrical connection path from the memory cell 301c to be read (second memory cell) to GND through the common source line 115, the source contact 116, the source line 114 and the source line driver 152, and a second electrical connection path from the memory cell 301c to be read to GND through the common source line 115, the source to the drain of the erase-mode memory cells 302c (first memory cell) in the on-state, the bit line 113-G connected to the erase-mode memory cells 302c, and the bit line grounding switch 311.

As described above, in this embodiment, memory cells that are always in the erase mode and not used for storage of data are prepared on the same word line as a memory cell to be read, and a discharge path to the ground is prepared on the bit line where the memory cells always in the erase mode exist. The erase-mode memory cells operate in the same manner as normal transistors and thus turn on when a voltage is applied to the word line, so that a path for discharge through the bit line of the erase-mode memory cells is created besides the common source line.

It is thereby possible to reduce the source resistance of memory cells at the reading. As shown in FIGS. 13 and 14, by reducing the source resistance, the source voltage becomes lower to suppress a decrease in the cell current, thus enabling high-speed operation.

Further, although the memory cell always in the erase mode cannot be used for storing data, because its area is significantly smaller than the source contact, an increase in the memory cell array area can be minimum. While the size of the memory cell always in the erase mode is the width of one memory cell, the size of several cells or larger is required for the source contact region. Thus, by reducing the frequency of placement of source contacts, the proportion of effective cells increases, so that an increase in circuit area can be suppressed.

Further, although the source contact portion causes a loss of regularity of the memory cell array and tends to degrade the manufacturing yield, because a grounding path is created by making normal memory cells always in the erase mode in the embodiment of this invention, they can be manufactured in the same manner as normal memory cells. Accordingly, this does not cause a loss of regularity of the memory cell array, and it is thus possible to improve the stability of lithography and etching, reduce variation of the shape and characteristics of memory cells, and enhance the yield.

For example, when the diffusion layer line resistance is about 500Ω per memory cell width, it has been necessary to provide the cell contact region for every 16 memory cells in order to achieve high-speed reading of 80 MHz or more in the precondition technique. On the other hand, in this embodiment, it is only necessary to provide the cell contact region for every 128 memory cells by providing the memory cell always in the erase mode for every 16 cells.

For example, when the width of three memory cells is required for the cell contact region, the number of memory cells that can actually store data increases by about 10% for the same memory cell array area compared with the precondition technique.

Second Embodiment of the Invention

A second embodiment of the invention is described hereinafter with reference to the drawings. This embodiment is different from the first embodiment in that the memory cell always in the erase mode can be placed on an arbitrary bit line.

Figure 22:
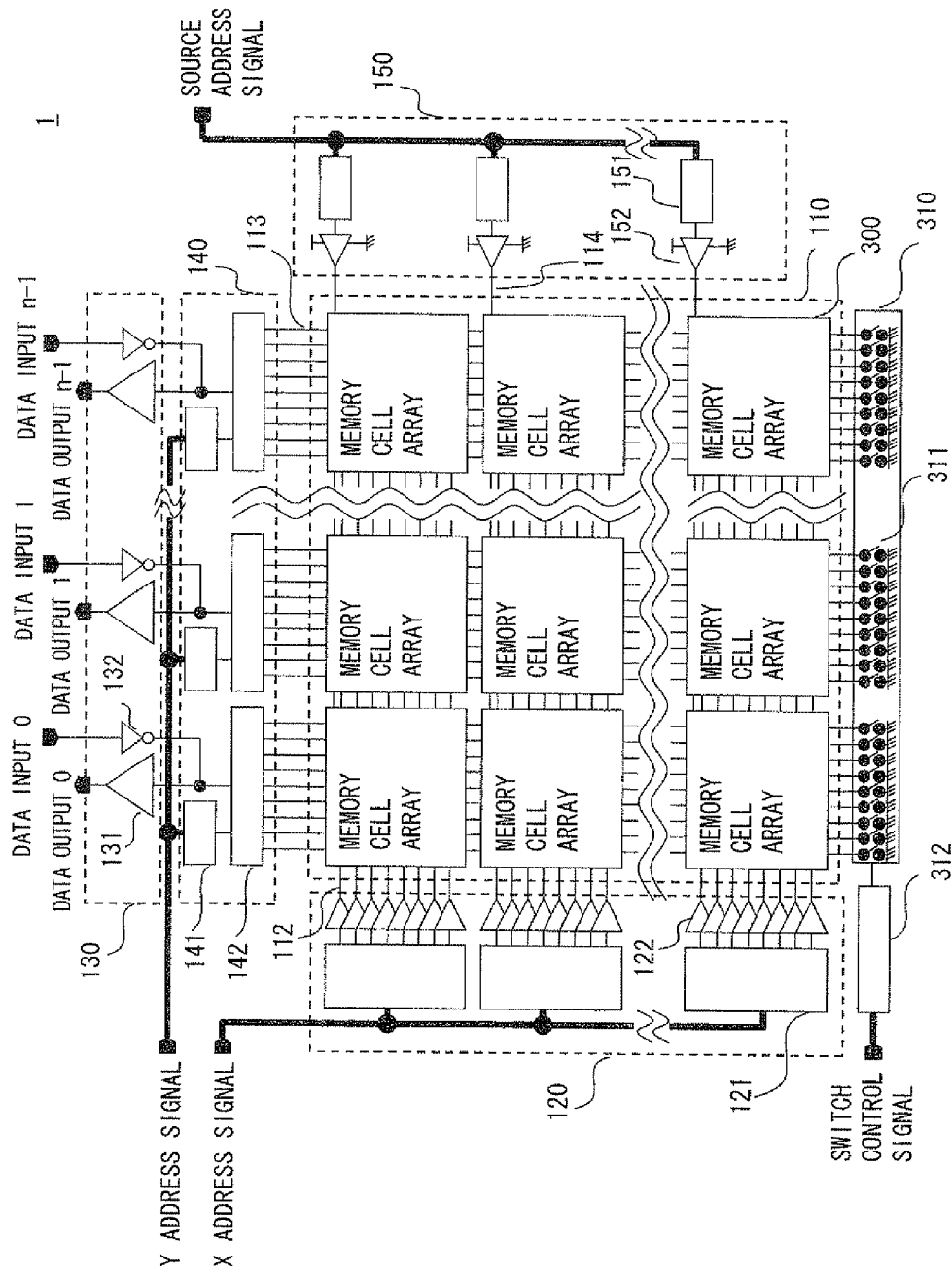
FIG. 22 is a circuit diagram showing a structure of a memory device according to a second embodiment of the present invention.

FIG. 22 shows a structure of a memory device according to the second embodiment of the present invention. The memory device 1 according to this embodiment is different from that of the first embodiment shown in FIG. 17 in the structure of the bit line grounding switch unit 310 and in that it further includes a switch control decoder 312. The other structure is the same as that of the first embodiment.

In the bit line grounding switch unit 310, a plurality of bit line grounding switches 311 are provided corresponding to the respective bit lines 113 of the plurality of memory cell arrays 300. Specifically, the bit line grounding switch 311 selects an arbitrary bit line 113 of the memory cell array 300 and connects it to GND.

The switch control decoder 312 decodes an input switch control signal and switches on and off the bit line grounding switch 311 of the corresponding bit line 113. Specifically, it separates the bit line where a memory cell to be read is placed from GND at the reading of the memory cell.

Further, in this embodiment, because memory cells always in the erase mode can be selected arbitrarily, all bit lines 113 are connected to the bit line selector 142, Note that the structure of the memory cell array 300 is the same as that of FIG. 18.

Figure 23:
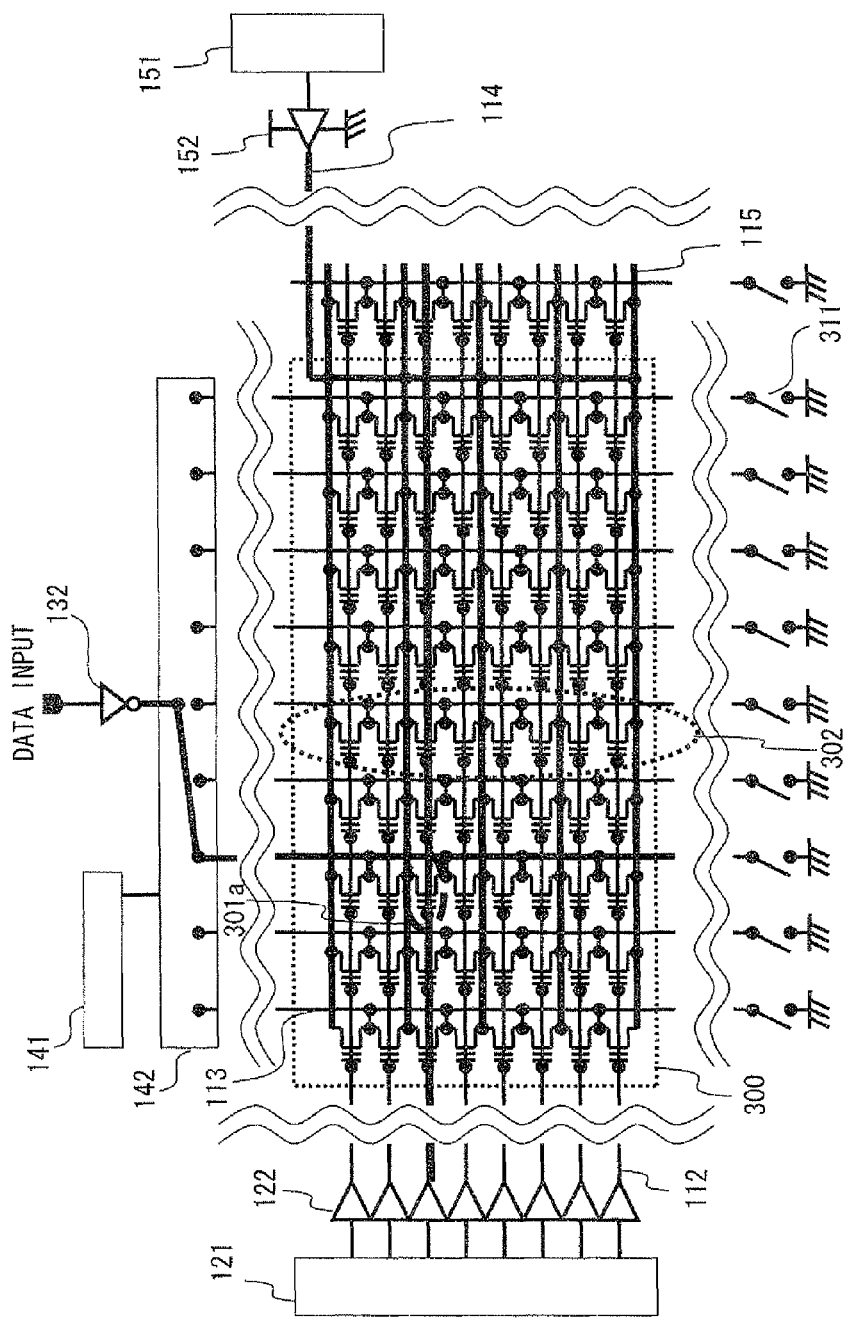
FIG. 23 is a diagram illustrating an operation of the memory device according to the second embodiment of the present invention.

A data write operation in the memory device 1 according to the second embodiment of the invention is described hereinafter with reference to FIG. 23.

Figure 19:
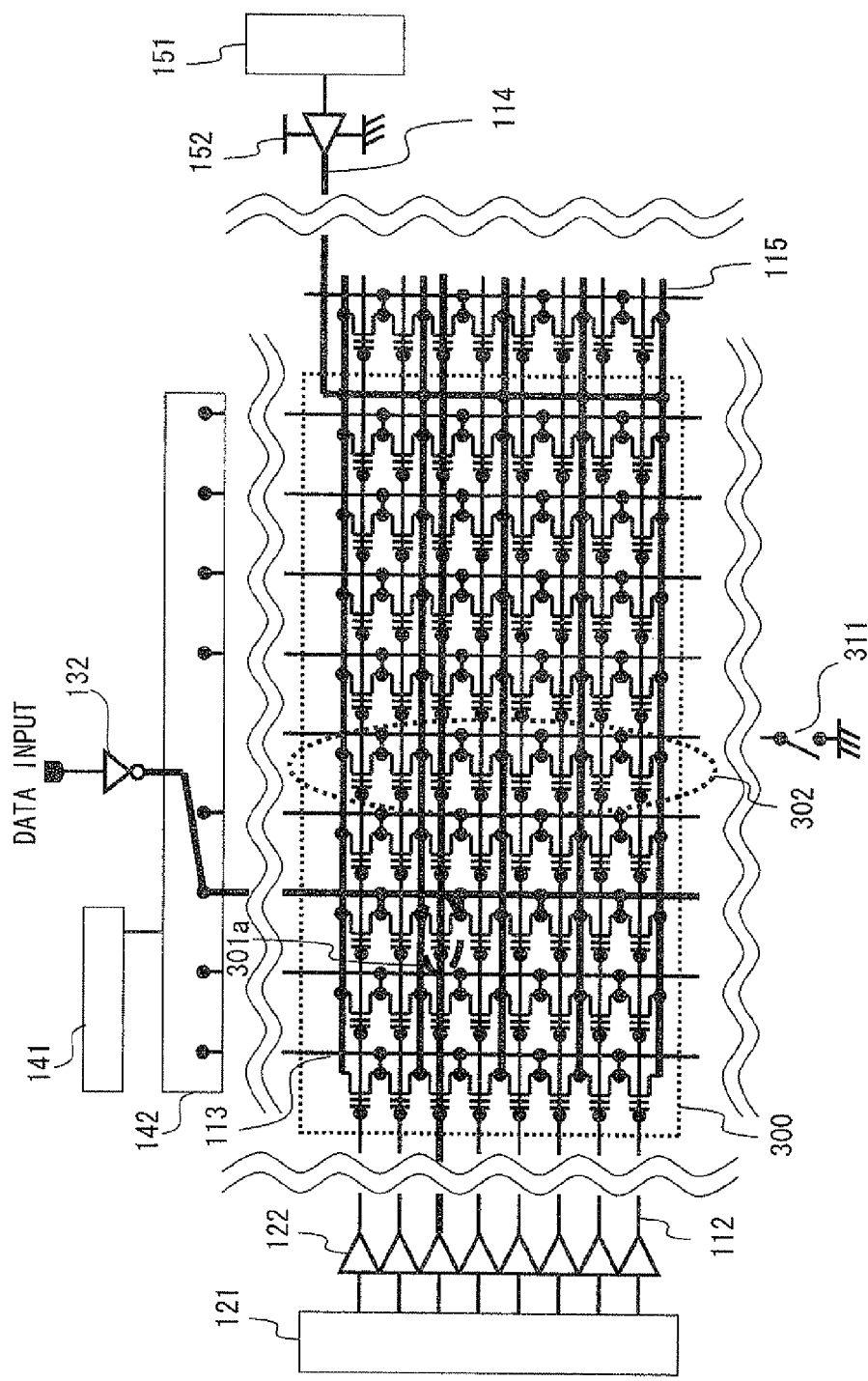
FIG. 19 is a diagram illustrating an operation of the memory device according to the first embodiment of the present invention.

The bit line 113 connected to a memory cell 301a to be written and the write bit line driver 132 are connected according to the y-address signal, a high voltage is applied to the source line 114 in a region where the memory cell 301a to be written is located according to the source address signal, a high voltage is applied to the word line 112 that is connected to the memory cell 301a to be written according to the x-address signal, and data is thereby written to the memory cell 301a, in the same manner as shown in FIG. 19.

In this embodiment, the erase-mode memory cells 302 that are always in the erase mode can be selected arbitrarily, and therefore the y-address decoder 141 makes skipping on the bit line 113-G that is connected to the erase-mode memory cells 302. Thus, the bit line 113-G is not selected according to the y-address, and the erase-mode memory cells 302 are not connected to the write bit line driver 132 during writing. Further, because the switch control decoder 312 does not perform control operation during writing, the bit line grounding switches 311 are all off, and the erase-mode memory cells 302 are separated from GND by the switches.

Therefore, electrons are not injected into the erase-mode memory cells 302 on the bit line 113-G and remain in the erase mode during writing, just like in FIG. 19. Further, address information is not needed for the bit line grounding switch 311 as in the first embodiment.

Note that, it is feasible that the y-address decoder does not perform skipping so that the erase-mode memory cells 302 operate as normal memory cells 301 to allow writing of given data.

Figure 24:
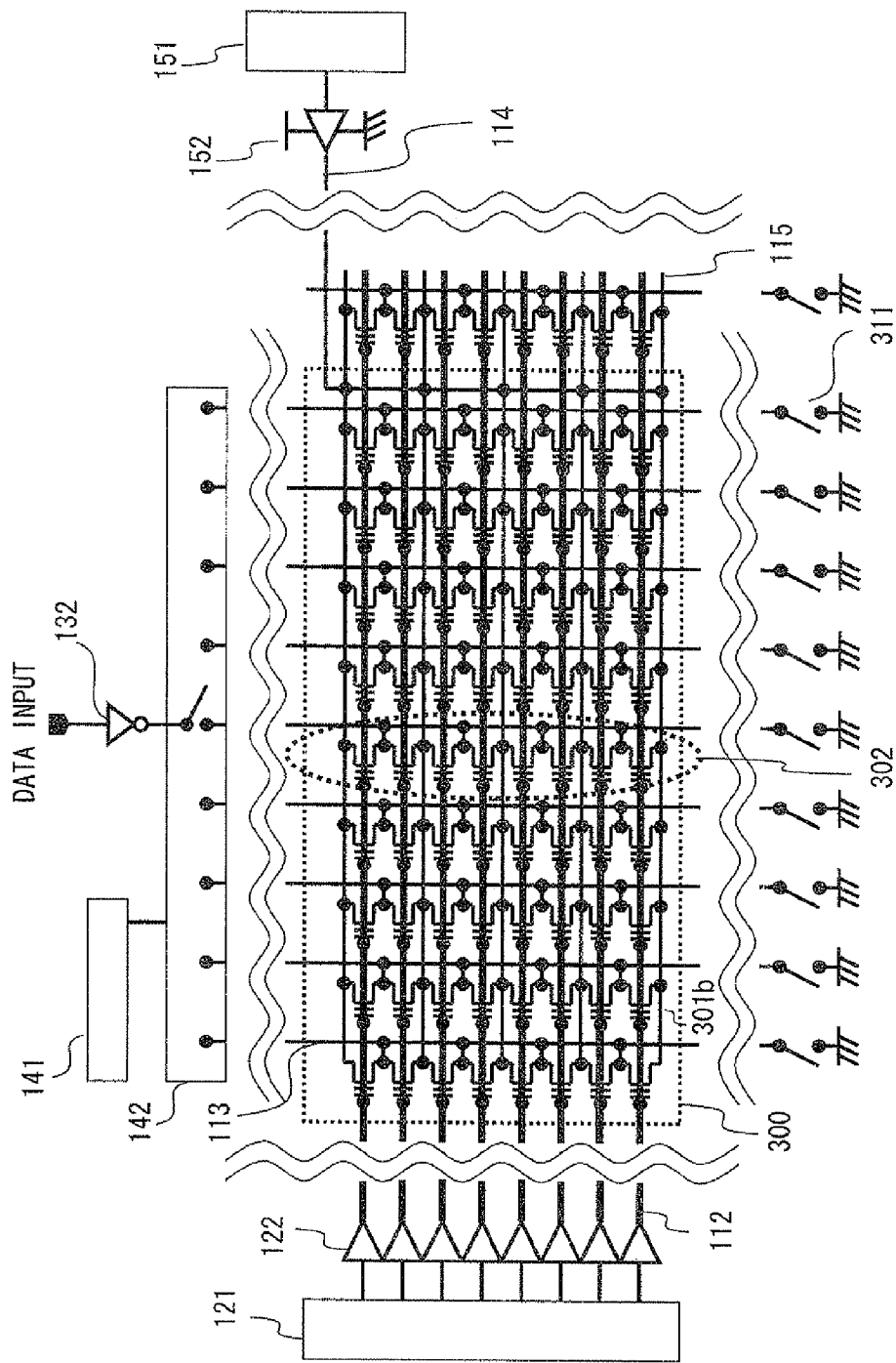
FIG. 24 is a diagram illustrating an operation of the memory device according to the second embodiment of the present invention.

A data erase operation in the memory device according to the second embodiment of the invention is described hereinafter with reference to FIG. 24.

Figure 20:
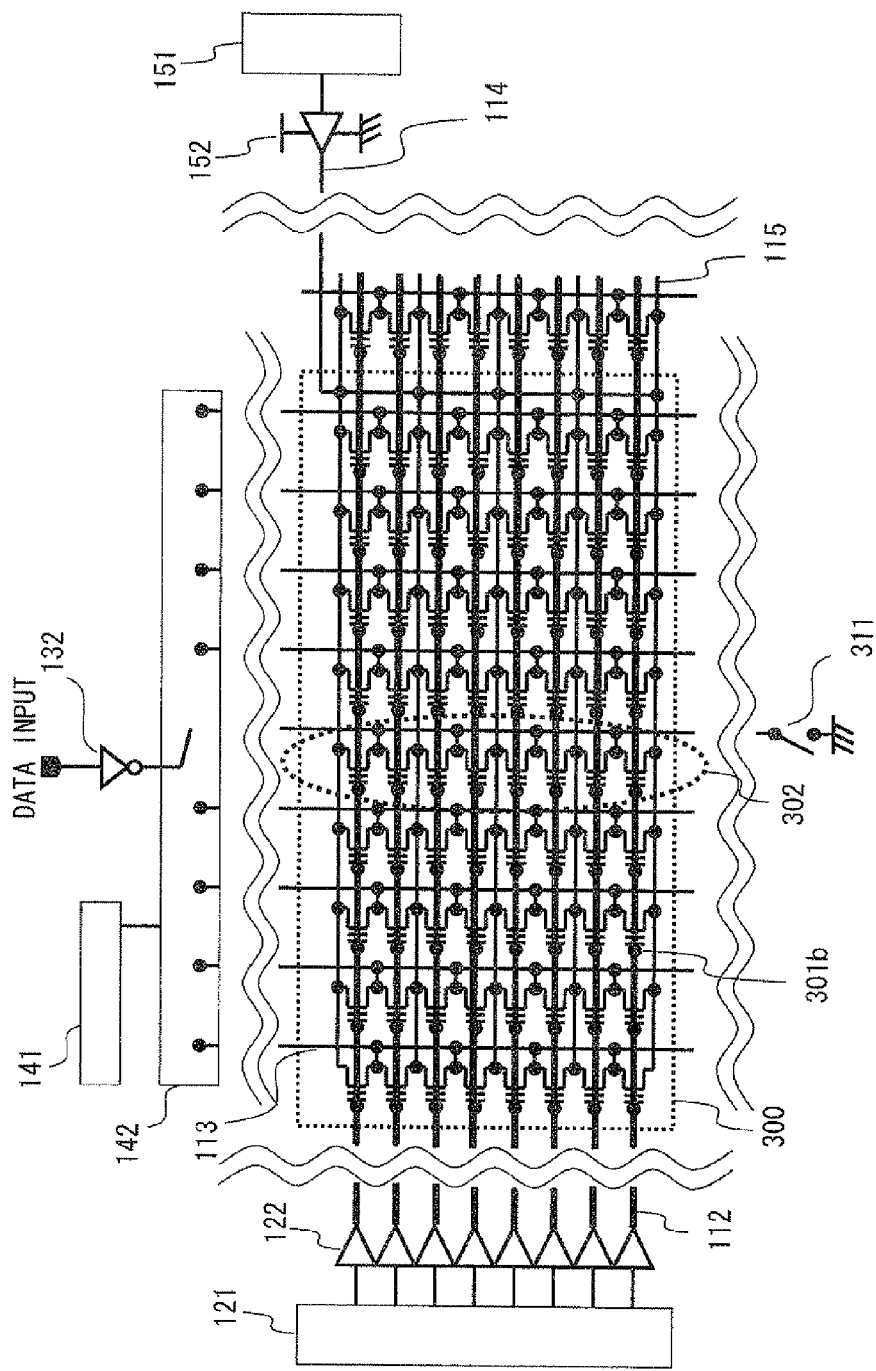
FIG. 20 is a diagram illustrating an operation of the memory device according to the first embodiment of the present invention.

Just like in FIG. 20, the potential of the bit line 113 is set to GND, the potential of the source line 114 is set to GND, and a negative high voltage is applied to the word line 112 that is connected to a memory cell 301b to be erased, so that data of the memory cell 301b on the word line 112 is erased.

At this time, the switch control decoder 312 does not perform control operation, and therefore the bit line grounding switches 311 are all off.

Because the memory cell 301b to be erased is decided by the x-address only, the erase-mode memory cell 302 that should be always in the erase mode is also erased when the memory cell 301b is erased, as in the first embodiment A data read operation in the memory device according to the second embodiment of the invention is described hereinafter with reference to FIG. 25.

Figure 21:
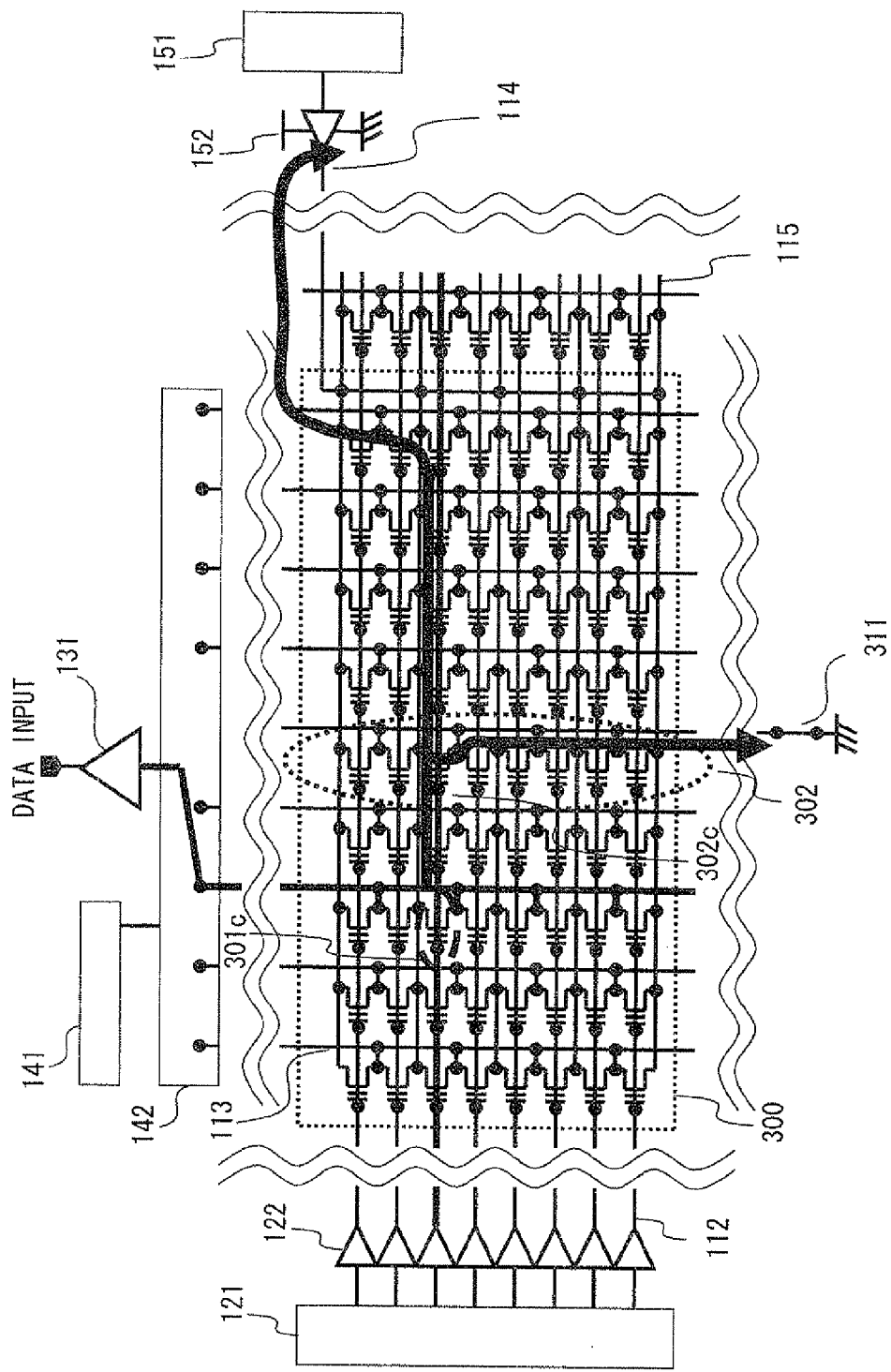
FIG. 21 is a diagram illustrating an operation of the memory device according to the first embodiment of the present invention.

In the same manner as shown in FIG. 21, the bit line 113 connected to a memory cell 301c to be read and the sense amplifier 131 are connected according to the y-address signal, a voltage is applied to the word line 112 connected to the memory cell 301c to be read according to the x-address signal, and the common source line 115 and the source line 114 are connected to GND.

At this time, in this embodiment, differently from the first embodiment, because there is a path to GND through the bit line grounding switch 311 in all bit lines 113, while the bit line where the erase-mode memory cells 302 always in the erase mode are located is connected to GND, the path to GND needs to be blocked for the bit lines other than the erase-mode memory cells 302.

Therefore, the switch control decoder 312 inputs a switch control signal in accordance with the placement of memory cells and decodes the signal to thereby make control to turn on the bit line grounding switch 311 of the bit line 113-G to which the erase-mode memory cells 302 are connected and turn off the bit line grounding switch 311 of the other bit lines 113. Note that, although only one bit line 113 is connected to GND in this example, memory cells corresponding to a plurality of bit lines 113 may serve as erase-mode memory cells, and the plurality of bit lines 113 may be grounded.

Then, the current that has flowed from the sense amplifier 131 into the common source line 115 through the memory cell 301c to be read flows out to GND not only through the source line driver 152 but also through the erase-mode memory cells 302 that are always in the erase mode, just like in the first embodiment.

Therefore, in this embodiment, as in the first embodiment, by the path from the erase-mode memory cells 302 to GND, it is possible to reduce the source resistance to enable high-speed operation and reduce the frequency of source contacts to suppress an increase in circuit size.

Further, in this embodiment, the discharge path to GND is prepared on all bit lines. It is thereby possible to increase and decrease the number of memory cells always in the erase mode according to the required reading speed.

For example, in the case of a product that requires a large storage capacity even with low-speed operation, the number of erase-mode memory cells may be controlled to decrease, and in the case of a product that requires high-speed operation even with a small storage capacity, the number of erase-mode memory cells may be controlled to increase. The switching between low-speed reading and high-speed reading can be made simply by switching the operation of a decoder using an external control signal, a fuse or the like, and it is thus possible to produce both of a product capable of high-speed reading with a small capacity and a product having a large capacity with low-speed operation using the same photomask.

In the precondition technique, it is necessary to place memory cells always in the erase mode for every 16 cells for high-speed reading; however, because there is no need to place memory cells always in the erase mode for low-speed reading of about 10 MHz, for example, the number of memory cells further increases by about 6% compared to the first embodiment.

Note that, the bit line selector performs skipping to select the memory cells always in the erase mode, and it can be implemented by a control program of a control circuit that supplies a y-address to the memory device, for example. This can be introduced at the time of binary generation by a compiler or the like of the control program.

In this case, in the circuit structure where the bit line to be skipped is connected to GND, for a CPU where NOP is assigned to data (DD) of erase cells, a part to be set to the erase mode may be kept to FF during compilation, and, for a CPU where another instruction is assigned to data (DD) of erase cells, this address may be skipped during compilation, for example.

Third Embodiment of the Invention

A third embodiment of the invention is described hereinafter with reference to the drawings. This embodiment is different from the second embodiment in that the bit line grounding switch is included in the bit line selector.

In the memory device according to this embodiment, the structure of the bit line selector 142 is different from that of FIG. 22 according to the second embodiment, and the bit line grounding switches 311 are not needed. The other structure is the same as that of the second embodiment.

Figure 26:
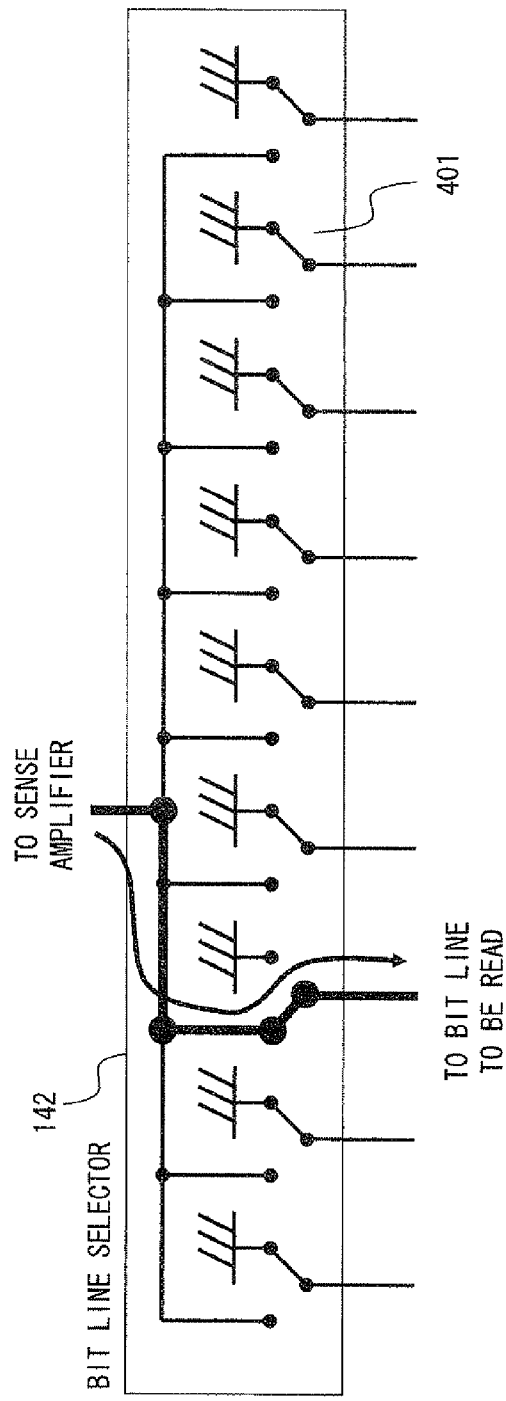
FIG. 26 is a circuit diagram showing a structure of a bit line selector according to a third embodiment of the present invention.
Figure 27A:
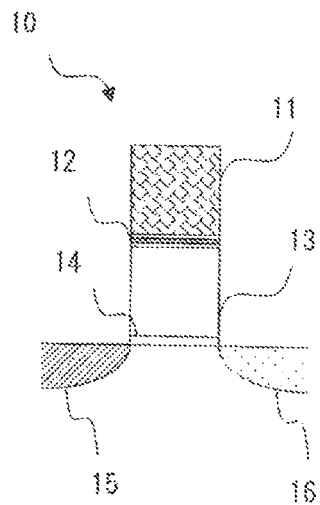
FIGS. 27A and 27B are diagrams showing a structure of a memory cell according to related art.
Figure 27B:
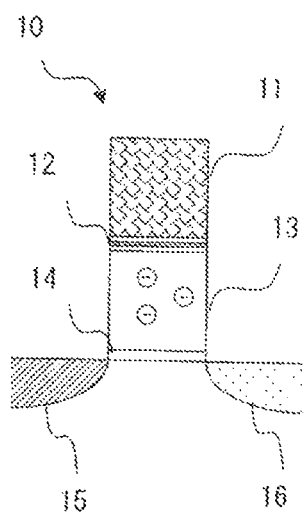
Figure 28A:
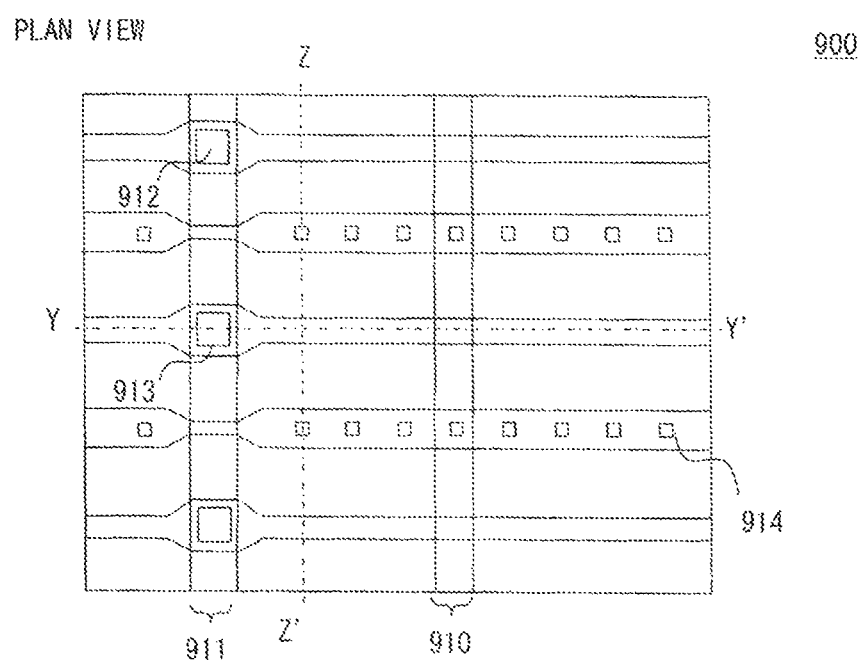
FIGS. 28A to 28C are diagrams showing a structure of a memory cell array according to related art.
Figure 28B:
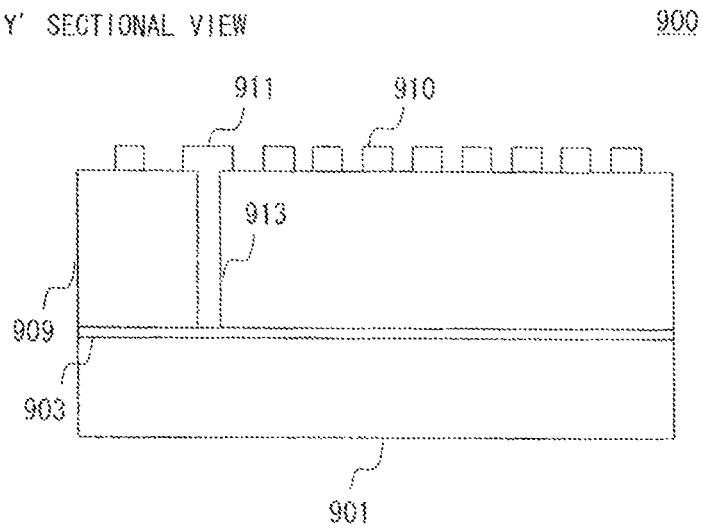
Figure 28C:
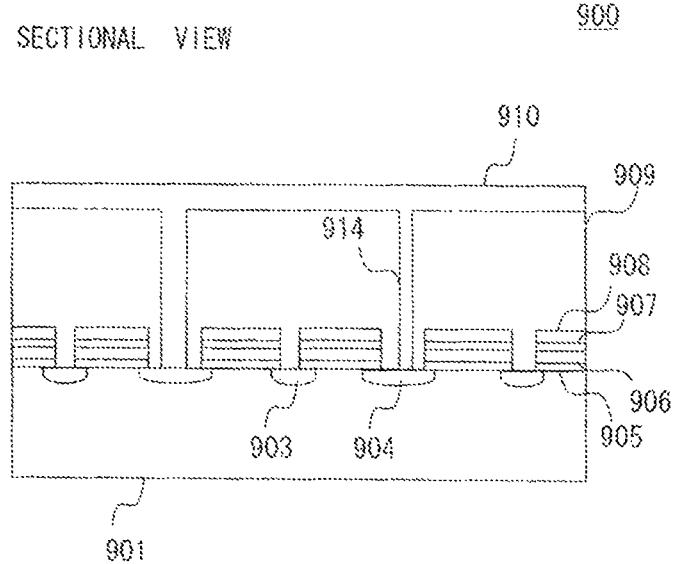

FIG. 26 shows a structure of a bit line selector according to the third embodiment of the invention. The bit line selector 142 includes switches 401 for the respective bit lines 113. The switch 401 switches a connection with the sense amplifier 131 or GND.

Figure 25:
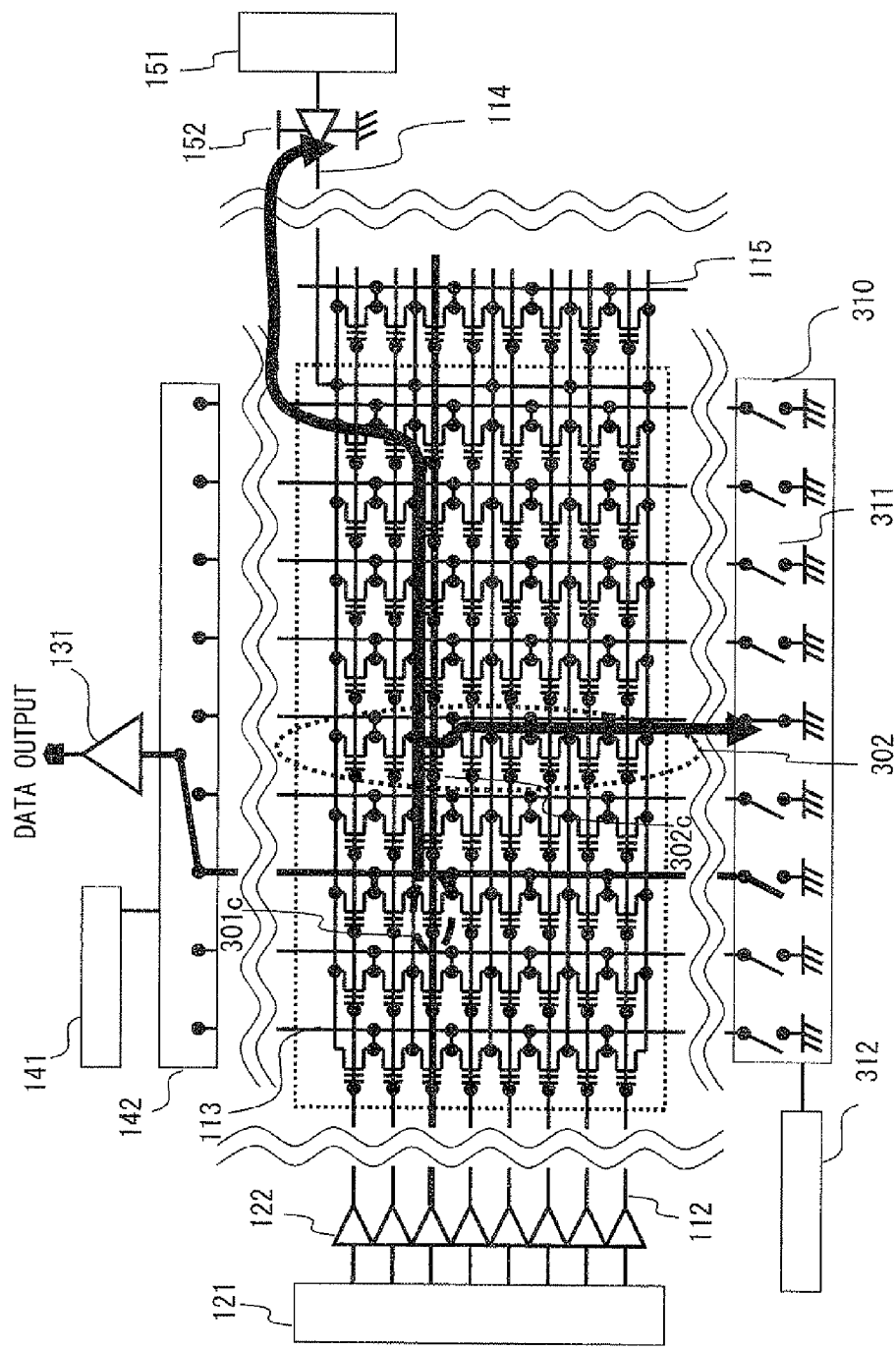
FIG. 25 is a diagram illustrating an operation of the memory device according to the second embodiment of the present invention.

As shown in FIG. 25, the path to GND needs to be blocked for the bit lines other than the erase-mode memory cells 302 in the second embodiment. Although this blocking is switched by the bit line grounding switches 311 in the second embodiment, it is switched by the switches 401 in the bit line selector 142 in this embodiment. Specifically, the switch 401 connects the bit line 113 connected to the memory cell 301c to be read to the sense amplifier 131 and connects the other bit lines 113 to GND according to the y-address decoder 141.

It is thereby possible to block the path to GND for the bit lines other than the erase-mode memory cells in the simpler structure than the second embodiment and further suppress an increase in circuit size.

Other Embodiments of the Invention

It should be noted that the present invention is not restricted to the above-described embodiments, and various changes and modifications may be made without departing from the scope of the invention.

For example, the VDD voltage and the GND voltage described in the above embodiments are not necessarily the same value, and they may be any independent voltages according to need.

For example, the present invention is also applicable to the structure in which a plurality of write states are prepared by adjusting the amount of electrons injected into the floating gate during writing and the word line voltage during reading, so that data of a plurality of bits can be stored into one cell.

The first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A memory device comprising:
    a memory cell array including a plurality of data memory cells in which data is stored and erased, and a plurality of erase mode memory cells in which data is only erased;
    a common source line to which sources of the plurality of data memory cells and the plurality of erase mode memory cells are commonly connected in the memory cell array; and
    a second electrical connection path further connecting the common source line to a ground voltage when the common source line forms a first electrical connection path and is connected to the ground voltage,
    wherein the second electrical connection path is formed using a first memory cell of the plurality of erase mode memory cells.

2. The memory device according to claim 1, wherein the first electrical connection path is formed when reading data of a second memory cell of the plurality of data memory cells.

3. The memory device according to claim 2, wherein a source of the second memory cell and a source of the first memory cell are connected through the common source line.

4. The memory device according to claim 2, wherein a gate of the second memory cell and a gate of the first memory cell are commonly connected.

5. The memory device according to claim 1, wherein the first memory cell is conducting when the first electrical connection path is formed.

6. The memory device according to claim 1, wherein the first memory cell has a drain connected to a bit line and forms the second electrical connection path with the bit line.

7. The memory device according to claim 6, comprising:
a switch circuit that turns on and off a connection between the bit line and the ground voltage.

8. The memory device according to claim 7, wherein the switch circuit turns on when the first electrical connection path is formed and turns off when the first electrical connection path is not formed.

9. The memory device according to claim 1, comprising:
a plurality of bit lines respectively connected to the plurality of erase mode memory cells,
wherein the plurality of bit lines and the plurality of erase mode memory cells form the second electrical connection path.

10. The memory device according to claim 9, comprising:
a plurality of switch circuits that turn on and off connections between the plurality of bit lines and the ground voltage.

11. The memory device according to claim 10, wherein the plurality of switch circuits turn on when the first electrical connection path is formed and turn off when the first electrical connection path is not formed.

12. The memory device according to claim 10, wherein, when any of the plurality of switch circuits is off, data can be written to the data mode memory cell connected to the switch circuit in off-state.

13. The memory device according to claim 1, wherein the plurality of memory cells are NOR flash memory cells.

14. A memory device comprising:
a memory cell array including a plurality of data memory cells in which data is stored and erased, and a plurality of erase mode memory cells in which data is only erased, each memory cell of the memory cell array having a source and a drain formed on a surface of a semiconductor substrate and a floating gate formed on the semiconductor substrate between the source and the drain;
a common source line formed continuously on the surface of the semiconductor substrate in the memory cell array so that sources of the plurality of memory cells are commonly connected thereto;
an upper source line formed on an interlayer dielectric film on the semiconductor substrate and connected to the common source line via a through hole; and
a second electrical connection path that connects the common source line and a ground voltage through the upper source line when the common source line and the upper source line form a first electrical connection path and are connected to the ground voltage,
wherein the second electrical connection path is formed using a memory cell of the plurality of erase mode memory cells.

15. A memory device comprising:
a memory cell array, including a plurality of data memory cells in which data is stored and erased and a plurality of erase mode memory cells in which data is only erased, arranged along a word line direction and a bit line direction;
a common source line that commonly connects sources of the memory cells of the memory cell array arranged along the word line direction; and
a ground circuit that connects drains of the plurality of erase mode memory cells arranged along the bit line direction to a ground according to grounding of the common source line.

16. The memory device according to claim 15, wherein the ground circuit connects a bit line connected to erase mode memory cells arranged in the bit line direction and a ground voltage.

17. The memory device according to claim 16, wherein
a plurality of ground circuits are included, and
the plurality of ground circuits are respectively connected to a plurality of bit lines.

* * * * *